(12) United States Patent
Bi et al.

(10) Patent No.: US 10,263,100 B1
(45) Date of Patent: Apr. 16, 2019

(54) BUFFER REGIONS FOR BLOCKING UNWANTED DIFFUSION IN NANOSHEET TRANSISTORS

(71) Applicant: International Business Machines Corporation, Armonk, NY (US)

(72) Inventors: Zhenxing Bi, Schenectady, NY (US); Kangguo Cheng, Schenectady, NY (US); Juntao Li, Cohoes, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/924,799

(22) Filed: Mar. 19, 2018

(51) Int. Cl.
| H01L 21/00 | (2006.01) |
| H01L 29/66 | (2006.01) |
| H01L 21/02 | (2006.01) |
| H01L 29/78 | (2006.01) |
| H01L 27/092 | (2006.01) |
| H01L 29/06 | (2006.01) |
| H01L 21/8238 | (2006.01) |

(52) U.S. Cl.
CPC .. *H01L 29/66795* (2013.01); *H01L 21/02192* (2013.01); *H01L 21/02603* (2013.01); *H01L 21/823821* (2013.01); *H01L 27/0924* (2013.01); *H01L 29/0653* (2013.01); *H01L 29/0673* (2013.01); *H01L 29/785* (2013.01)

(58) Field of Classification Search
CPC ............. H01L 29/0673; H01L 29/0669; H01L 21/02603
See application file for complete search history.

(56) References Cited

U.S. PATENT DOCUMENTS

| 8,753,942 B2 | 6/2014 | Kuhn et al. |
| 8,778,768 B1 | 7/2014 | Chang et al. |
| 8,853,781 B2 | 10/2014 | Cheng et al. |
| 8,872,172 B2 | 10/2014 | Cheng et al. |
| 9,224,810 B2 | 12/2015 | Kim et al. |
| 9,287,357 B2 | 3/2016 | Rodder et al. |
| 9,362,355 B1 | 6/2016 | Cheng et al. |
| 9,472,555 B1 | 10/2016 | Balakrishnan et al. |
| 9,484,423 B2 | 11/2016 | Obradovic et al. |
| 9,583,486 B1 * | 2/2017 | Ando .................. H01L 27/0886 |
| 9,583,507 B2 | 2/2017 | Cheng et al. |
| 9,634,091 B2 | 4/2017 | Ching et al. |

(Continued)

OTHER PUBLICATIONS

Loubet et al., "Stacked Nanosheet Gate-All-Around Transistor to Enable Scaling Beyond FinFET", 2017 Symposium on VLSI Technology Digest of Technical Papers, pp. T230-T231.

*Primary Examiner* — Nicholas J Tobergte
(74) *Attorney, Agent, or Firm* — Cantor Colburn LLP; Vazken Alexanian

(57) ABSTRACT

Embodiments of the invention are directed to a method of fabricating a semiconductor device. A non-limiting example of the method includes performing fabrication operations to form a nanosheet field effect transistor device. The fabrication operations include forming a sacrificial nanosheet and a channel nanosheet over a substrate, forming a diffusion barrier layer between the sacrificial nanosheet and the channel nanosheet, wherein a diffusion coefficient of the diffusion barrier layer is selected to substantially prevent a predetermined semiconductor material from diffusing through the diffusion barrier layer.

20 Claims, 20 Drawing Sheets

(56) References Cited

U.S. PATENT DOCUMENTS

| | | | |
|---|---|---|---|
| 9,923,055 B1 * | 3/2018 | Cheng | H01L 29/0665 |
| 9,947,593 B2 * | 4/2018 | Doris | H01L 27/0922 |
| 9,991,261 B2 * | 6/2018 | Mitard | H01L 29/78684 |
| 2015/0295084 A1 | 10/2015 | Obradovic et al. | |
| 2016/0071729 A1 | 3/2016 | Hatcher et al. | |
| 2018/0122900 A1 * | 5/2018 | Cheng | H01L 29/0665 |
| 2018/0308988 A1 * | 10/2018 | Chao | H01L 21/2255 |

* cited by examiner

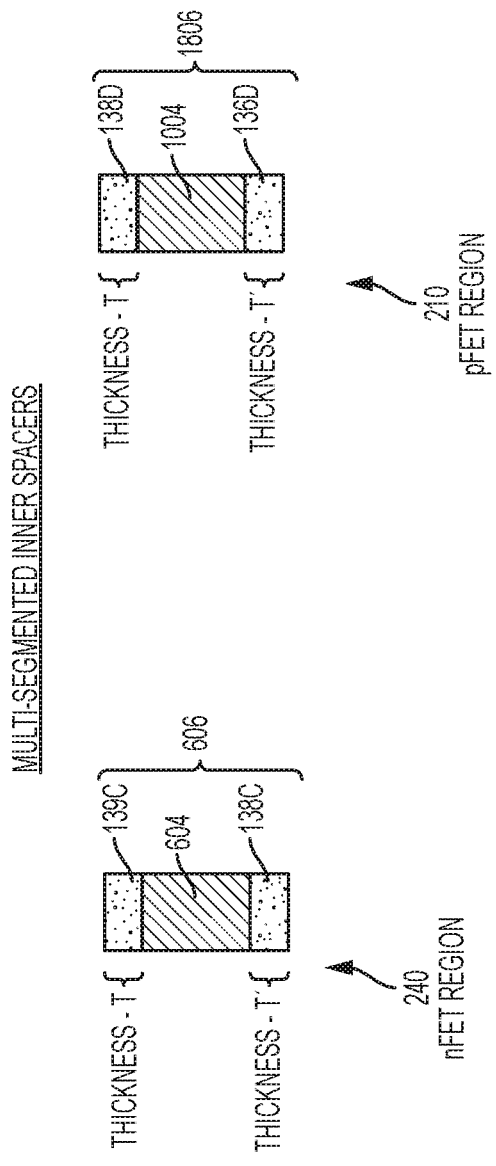

BUFFER REGIONS FOR BLOCKING UNWANTED DIFFUSION IN NANOSHEET TRANSISTORS

BACKGROUND

The present invention relates in general to fabrication methods and resulting structures for semiconductor devices. More specifically, the present invention relates to fabrication methods and resulting structures for vertically stacked nanosheet transistors configured and arranged to provide selectively formed buffer regions for blocking unwanted diffusion between sacrificial nanosheets and channel nanosheets.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions. Nanosheet transistor configurations enable fuller depletion in the nanosheet channel regions and reduce short-channel effects.

SUMMARY

Embodiments of the invention are directed to a method of fabricating a semiconductor device. A non-limiting example of the method includes performing fabrication operations to form a nanosheet field effect transistor device. The fabrication operations include forming a sacrificial nanosheet and a channel nanosheet over a substrate, forming a diffusion barrier layer between the sacrificial nanosheet and the channel nanosheet, wherein a diffusion coefficient of the diffusion barrier layer is selected to substantially prevent a predetermined semiconductor material from diffusing through the diffusion barrier layer.

Embodiments of the invention are directed to a method fabricating a semiconductor device. A non-limiting example of the method includes performing fabrication operations to form a nanosheet field effect transistor device. The fabrication operations include forming a first diffusion barrier layer across from a major surface of a substrate, forming a first nanosheet stack on an opposite side of the first diffusion barrier layer from the major surface of the substrate, wherein the first nanosheet stack includes alternating channel nanosheets, stack diffusion barrier layers, and sacrificial nanosheets. The first nanosheet stack is configured and arranged such that the stack diffusion barrier layers are positioned between the sacrificial nano sheets and the channel nanosheets. A diffusion coefficient of the stack diffusion barrier layer is selected to substantially prevent a predetermined semiconductor material from diffusing through the stack diffusion barrier layer.

Embodiments of the invention are directed to a nanosheet field effect transistor device that includes a substrate, a first channel nanosheet formed over the substrate, a second channel nanosheet formed over the first channel nanosheet, and a multi-segmented inner spacer formed between the first channel nanosheet and the second channel nanosheet. A source region is communicatively coupled to the first channel nanosheet and the second channel nanosheet. A drain region is communicatively coupled to the first channel nanosheet and the second channel nanosheet. A gate region is communicatively coupled to the first channel nanosheet and the second channel nanosheet. The multi-segmented inner spacer includes a main body and a diffusion barrier region. A diffusion coefficient of the diffusion barrier region is selected to substantially prevent a predetermined semiconductor material from diffusing through the diffusion barrier region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIG. 1B depicts an isolated cross-sectional view of a multi-segmented inner spacer according to embodiments of the invention;

FIGS. 2-19 depict cross-sectional views of a section of a substrate/wafer after various fabrication operations to form an nFET nanosheet transistor and a pFET nanosheet transistor thereon according to embodiments of the present invention, in which:

FIG. 2 depicts a cross-sectional view of the nFET nanosheet transistor and the pFET nanosheet transistor after a fabrication stage according to embodiments of the present invention;

FIG. 3 depicts a cross-sectional view of the nFET nanosheet transistor and the pFET nanosheet transistor after another fabrication stage according to embodiments of the present invention;

FIG. 4 depicts a cross-sectional view of the nFET nanosheet transistor and the pFET nanosheet transistor after another fabrication stage according to embodiments of the present invention;

FIG. 5 depicts a cross-sectional view of the nFET nanosheet transistor and the pFET nanosheet transistor after another fabrication stage according to embodiments of the present invention;

FIG. 6 depicts a cross-sectional view of the nFET nanosheet transistor and the pFET nanosheet transistor after another fabrication stage according to embodiments of the present invention;

FIG. 7 depicts a cross-sectional view of the nFET nanosheet transistor and the pFET nanosheet transistor after another fabrication stage according to embodiments of the present invention;

FIG. 8 depicts a cross-sectional view of the nFET nanosheet transistor and the pFET nanosheet transistor after another fabrication stage according to embodiments of the present invention;

FIG. 9 depicts a cross-sectional view of the nFET nanosheet transistor and the pFET nanosheet transistor after another fabrication stage according to embodiments of the present invention;

FIG. 10 depicts a cross-sectional view of the nFET nanosheet transistor and the pFET nanosheet transistor after another fabrication stage according to embodiments of the present invention;

FIG. 11 depicts a cross-sectional view of the nFET nanosheet transistor and the pFET nanosheet transistor after another fabrication stage according to embodiments of the present invention;

FIG. 12 depicts a cross-sectional view of the nFET nanosheet transistor and the pFET nanosheet transistor after another fabrication stage according to embodiments of the present invention;

FIG. 13 depicts a cross-sectional view of the nFET nanosheet transistor and the pFET nanosheet transistor after another fabrication stage according to embodiments of the present invention;

FIG. 14 depicts a cross-sectional view of the nFET nanosheet transistor and the pFET nanosheet transistor after another fabrication stage according to embodiments of the present invention;

FIG. 15 depicts a cross-sectional view of the nFET nanosheet transistor and the pFET nanosheet transistor after another fabrication stage according to embodiments of the present invention;

FIG. 16 depicts a cross-sectional view of the nFET nanosheet transistor and the pFET nanosheet transistor after another fabrication stage according to embodiments of the present invention;

FIG. 17 depicts a cross-sectional view of the nFET nanosheet transistor and the pFET nanosheet transistor after another fabrication stage according to embodiments of the present invention;

FIG. 18 depicts a cross-sectional view of the nFET nanosheet transistor and the pFET nanosheet transistor after another fabrication stage according to embodiments of the present invention; and FIG. 19 depicts a cross-sectional view of the nFET nanosheet transistor and the pFET nanosheet transistor after another fabrication stage according to embodiments of the present invention.

DETAILED DESCRIPTION

Figure 1A:
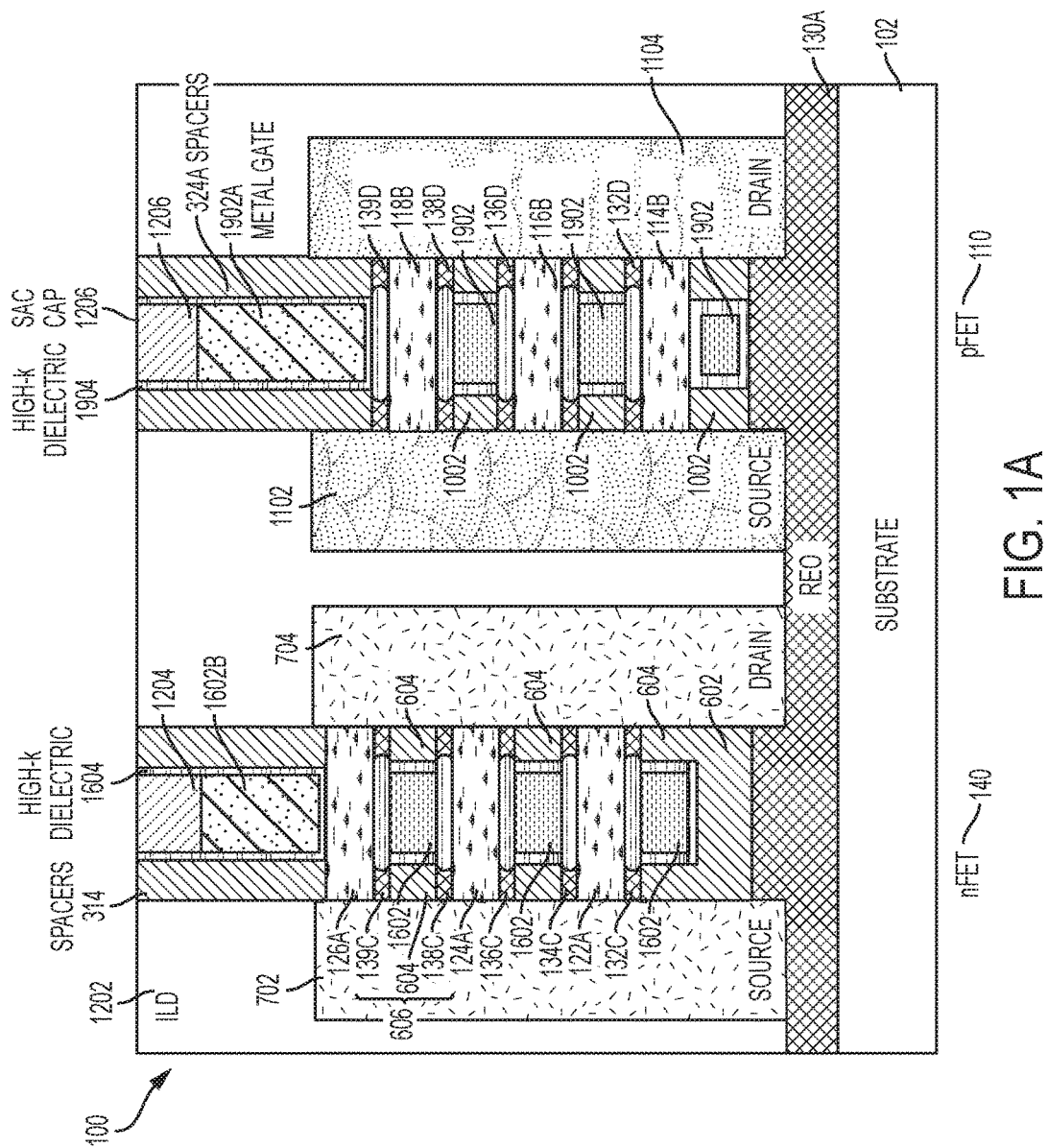
FIG. 1A depicts a cross-sectional view of a section of a substrate/wafer having an nFET nanosheet transistor and a pFET nanosheet transistor formed thereon according to embodiments of the present invention.

It is understood in advance that although this invention includes a detailed description of exemplary GAA nanosheet FET architectures having silicon (Si) nFET channels and silicon germanium (SiGe) pFET channels, embodiments of the invention are not limited to the particular FET architectures or materials described in this specification. Rather, embodiments of the present invention are capable of being implemented in conjunction with any other type of nanosheet/nanowire FET architecture or materials now known or later developed. In this detailed description and in the claims, the terms nanosheet and nanowire are treated as being synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nano sheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are silicon (Si) and the sacrificial nanosheets are silicon germanium (SiGe). For p-type FETs, the channel nanosheets are SiGe and the sacrificial nanosheets are Si. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a particular application. For example, unwanted diffusion is becoming an increasingly important issue, in particular for nanosheet-based CMOS integrations. For n-type GAA nanosheet transistor configurations in which the channel nanosheet are silicon (Si) and the sacrificial nanosheets are silicon germanium (SiGe), Ge can diffuse from the SiGe sacrificial nanosheets into the Si channel nanosheets due to the high thermal budget of the downstream integration processes (e.g., shallow trench isolation (STI) oxide anneal, S/D epitaxy growth, etc.). Unwanted Ge diffusion can cause a series of issues, including, for example, shifting the gate threshold voltage ($V_T$) and poor SiGe indentation profiles for the inner spacer formation operations. Low thermal budget fabrication processes have been developed in an attempt to counter unwanted Ge diffusion. However, low thermal budget fabrication processes suffer from drawbacks including, for example, the formation of low quality STI oxides.

Turning now to an overview of aspects of the invention, embodiments of the invention provide fabrication methods and resulting structures for vertically stacked nanosheet transistors configured and arranged to provide selectively formed buffer/diffusion regions for blocking unwanted diffusion of elements (e.g., Ge) between sacrificial nanosheets and channel nanosheets. In embodiments of the invention, fabrication methodologies include processes to form a stacked nanosheet structure that will be processed to form the channel region of the final nanosheet semiconductor device. The stacked nanosheet structure includes channel nanosheets and sacrificial nanosheet separated by buffer/diffusion layers. The sacrificial nanosheets and portions of the buffer/diffusion layers will be removed and released from the channel nanosheets, thereby forming the channel region of the device.

In embodiments of the invention, the diffusion characteristics (e.g., the diffusion coefficient (D)) and/or the thicknesses) of each buffer/diffusion barrier layer are selected to prevent a predetermined semiconductor material from diffusing through the buffer/diffusion barrier layer. In embodiments of the invention, the predetermined semiconductor material is Ge. The unintended diffusion described herein can result from heat generated by downstream high-thermal-budget fabrication operations for fabricating the nanosheet transistors, including, for example, STI oxide anneal operations, source/drain (S/D) epitaxy growth operations, and the like.

In embodiments of the invention, the composition of the buffer/diffusion barrier layers can be selected to facilitate the buffer/diffusion barrier layers being epitaxially grown from either one of the Si nanosheet layers or from one of the SiGe nanosheet layers. In embodiments of the invention, in order to facilitate epitaxial growth of one layer from the other, the lattice structures are matched between the alternating layers of Si nanosheet layers, buffer/diffusion barrier layers, and SiGe nanosheet layers. In embodiments of the invention, the necessary lattice matching is achieved by forming the alternating layers of channel nanosheet layers, buffer/diffusion barrier layers, and sacrificial nanosheet layers from single crystalline lattice structure materials.

In embodiments of the invention, materials that can be configured and arranged to satisfy composition, diffusion coefficient (D), and or thicknesses parameters of the buffer/diffusion barrier layers in accordance with aspects of the invention include REO materials formed from rare earth elements. In embodiments of the invention, the REO materials can include a single crystalline REO material or of a combination of crystalline REO materials.

In embodiments of the invention, multi-segmented inner spacers are formed to include a central inner spacer body, a bottom inner spacer region, and a top inner spacer region. In embodiments of the invention, the top/bottom inner spacers provide additional protection at the edges of the nanosheet channels against attack from other downstream fabrication processes, which provides further protection against the creation of nanosheet channel voids that can result in shorts (e.g., from source/drain through the gate).

Turning now to a more detailed description of aspects of the invention, FIG. 1A depicts a cross-sectional view of a section 100 of a substrate/wafer 102 having an nFET nanosheet transistor 140 and a pFET nanosheet transistor 110 formed thereon according to embodiments of the present invention. For ease of illustration and description, only a single nFET nanosheet transistor 140 and a single pFET nanosheet transistor are shown. However, it should be understood that the teachings in this detailed description can be applied to the fabrication of a substrate/wafer having any number of nFET nanosheet transistors and pFET nanosheet transistors formed thereon.

As shown in FIG. 1A, and in accordance with aspects of the invention, a rare earth oxide (REO) region 130A is over the substrate 102. The REO region 130A functions as a bottom insulation region. The nFET nanosheet transistor 140 is over the REO region 130A in an nFET region 240 (shown in FIG. 2) of the substrate 102, and the pFET nanosheet transistor 110 is formed over the REO region 130A in a pFET region 210 (shown in FIG. 2) of the substrate 102. The nFET nanosheet transistor 140 includes stacked nanosheet channels 122A, 124A, 126A positioned between a source region 702 and a drain region 704. Multi-segmented gate metal regions 1602B, 1602 and multi-segmented high-k dielectric regions 1604 are formed over and around the stacked nanosheet channels 122A, 124A, 126A in a GAA configuration. In the example shown in FIG. 1A, the stacked nanosheet channels 122A, 124A, 126A are silicon (Si). The nFET nanosheet transistor 140 also includes a portion of an interlayer dielectric (ILD) region 1202, gate spacers 314, and a self-aligned contact (SAC) cap 1204, configured and arranged as shown.

Similarly, the pFET nanosheet transistor 110 includes stacked nanosheet channels 114B, 116B, 118B positioned between a source region 1102 and a drain region 1104. Multi-segmented gate metal regions 1902A, 1902 and multi-segmented high-k dielectric regions 1904 are formed over and around the stacked nanosheet channels 114B, 116B, 118B in a GAA configuration. In the example shown in FIG. 1A, the stacked nanosheet channels 114B, 116B, 118B are silicon germanium (SiGe). The pFET nanosheet transistor 110 also includes a portion of the interlayer dielectric (ILD) region 1202, gate spacers 324A, and a self-aligned contact (SAC) cap 1206, configured and arranged as shown.

In embodiments of the invention, and as described in greater detail in connection with the fabrication operations shown in FIGS. 2-19, the nFET nanosheet transistor 140 and the pFET nanosheet transistor 110 are fabricated over the REO region 130A and the substrate 102 using a novel GAA configuration and fabrication process. In embodiments of the invention, the novel GAA fabrication process includes forming alternating layers of Si nanosheet layers 122, 124, 126 (shown in FIG. 2), buffer/diffusion barrier layers 132, 134, 136, 138, 139 (shown in FIG. 2), and SiGe nanosheet layers 114, 116, 118 (shown in FIG. 2). In the nFET region 240 (shown in FIG. 2) of the substrate 102, fabrication operations will be applied to fabricate the channel nanosheets 122A, 124A, 126A of the nFET nanosheet transistor 140 from the Si nanosheet layers 122, 124, 126, and fabrication operations will be applied to fabricate sacrificial nanosheets 114A, 116A, 118A (shown in FIG. 3) of the nFET nanosheet transistor 140 from the SiGe nanosheet layers 114, 116, 118. In the pFET region 210 (shown in FIG. 2) of the substrate 102, fabrication operations will be applied to fabricate the channel nanosheets 114B, 116B, 118B of the pFET nanosheet transistor 110 from the SiGe nanosheet layers 114, 116, 118, and fabrication operations will be applied to fabricate sacrificial nanosheets 122B, 124B, 126B (shown in FIG. 3) of the pFET nanosheet transistor 110 from the Si nanosheet layers 122, 124, 126. The use of multiple SiGe/REO/Si layers to form the channel regions of the n FET nanosheet transistor 140 and the p FET nanosheet transistor 110 provides desirable device characteristics, including the introduction of strain at the interface between the REO and the Si and/or SiGe nanosheet channel regions.

In embodiments of the invention, the alternating layers are configured and arranged such that one of the buffer/diffusion barrier layers 132, 134, 136, 138, 139 is positioned between the Si nanosheet layers 122, 124, 126 the SiGe nanosheet layers 114, 116, 118. In embodiments of the invention, the diffusion characteristics (e.g., the diffusion coefficient (D)) and/or the thicknesses (e.g., T, T' shown in FIG. 2) of each buffer/diffusion barrier layer 132, 134, 136, 138, 139 are selected to prevent a predetermined semiconductor material from diffusing through the buffer/diffusion barrier layer 132, 134, 136, 138, 139. In embodiments of the invention, the thicknesses T, T' can be the same or different. The diffusion coefficient (D) of a material determines the rate at which an element moves in material by diffusion. Diffusion coefficients (D) depend strongly on temperature and are expressed in $cm^2/sec$. Diffusion coefficients (D) vary between elements by orders of magnitude. For example, the diffusion coefficient for gold, Au, through Si is in the range of $10^{-3}$ $cm^2/sec$ (i.e., a fast diffusant) while the diffusion coefficient for Sb through Si is in the range of $10^{-17}$ $cm^2/sec$. In the example embodiment of the invention depicted in FIG. 2, the predetermined semiconductor material is Ge. In embodiments of the invention having channel/sacrificial nanosheet materials other than Si and SiGe, other predetermined semiconductor materials can be used. The unintended diffusion described herein can result from heat generated by downstream high-thermal-budget fabrication operations for fabricating the nFET nanosheet transistor 140 and the pFET nanosheet transistor 110, including, for example, STI oxide anneal operations, source/drain (S/D) epitaxy growth operations, and the like.

In embodiments of the invention, the buffer/diffusion barrier layers 132, 134, 136, 138, 139 can be formed from materials having compositions, diffusion coefficients (D), and/or thicknesses selected to prevent or substantially suppress the diffusion of the predetermined semiconductor material(s) through the buffer/diffusion barrier layers 132, 134, 136, 138, 139 into an adjacent channel or sacrificial layer. In embodiments of the invention, the composition of the buffer/diffusion barrier layers 132, 134, 136, 138, 139 can be selected to facilitate the buffer/diffusion barrier layers 132, 134, 136, 138, 139 being epitaxially grown from either one of the Si nanosheet layers 122, 124, 126 or from one of the SiGe nanosheet layers 114, 116, 118. In embodiments of the invention, in order to facilitate epitaxial growth, one layer (130, 112, 114, 132, 122, 134, 116, 136, 124, 138, 118, 139, 126) from the other, the lattice structures are matched between the alternating layers of Si nanosheet layers 122, 124, 126, buffer/diffusion barrier layers 132, 134, 136, 138, 139, and SiGe nanosheet layers 114, 116, 118. In embodiments of the invention, the necessary lattice matching is achieved by forming the alternating layers of channel nanosheet layers 122, 124, 126, buffer/diffusion barrier layers 132, 134, 136, 138, 139, and sacrificial nanosheet layers 114, 116, 118 from single crystalline lattice structure materials. In embodiments of the invention, the buffer/diffusion barrier layers 132, 134, 136, 138, 139 can include or be formed from a single crystalline material.

In embodiments of the invention, materials that can be configured and arranged to satisfy composition, diffusion coefficient (D), and or thicknesses parameters of the buffer/diffusion barrier layers 132, 134, 136, 138, 139 in accordance with aspects of the invention include REO materials formed from rare earth elements. In embodiments of the invention, the REO materials can include a single crystalline REO material or of a combination of crystalline REO materials. As used herein, rare earth elements include, but are not limited to, lanthanides such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu).

As previously noted herein, the thicknesses of the buffer/diffusion barrier layers 132, 134, 136, 138, 139 can be formed from materials having thicknesses selected to prevent or substantially suppress the diffusion of the predetermined semiconductor material(s) through the buffer/diffusion barrier layers 132, 134, 136, 138, 139 into an adjacent channel or sacrificial layer. In some embodiments of the invention, the thicknesses of the buffer/diffusion barrier layers 132, 134, 136, 138, 139 can be from about 1 nm to about 2 nm. In some embodiments of the invention, the thicknesses of the buffer/diffusion barrier layers 132, 134, 136, 138, 139 can be designed to have predetermined thicknesses, to have thicknesses within predetermined ranges, to have thicknesses having fixed ratios with respect to each other, or to have thicknesses based on any other consideration or combination of considerations in accordance with the functionality described herein.

In downstream fabrication operations, end portions of the sacrificial nanosheet layers (SiGe nanosheet layers 114, 116, 118 in the nFET region 240; and Si nanosheet layers 122, 124, 126 in the pFET region 210) are replaced with inner spacers 604, 1002 (shown in FIG. 1A). In embodiments of the invention, the remaining central portions of the sacrificial nanosheet layers (SiGe nanosheet layers 114, 116, 118 in the nFET region 240; and Si nanosheet layers in the pFET region 210) are released from the buffer/diffusion barrier layers 132, 134, 136, 138, 139, and central portions of the buffer/diffusion barrier layers 132, 134, 136, 138, 139 are released from the channel nanosheet layers (Si nanosheet layers 122, 124, 126 in the nFET region 240; and SiGe nanosheet layers 114, 116, 118 in the pFET region 210). After additional fabrication operations, multi-segmented inner spacers are formed in the nFET nanosheet transistor 140 (e.g., 139C, 604, 138C), as well as in the pFET nanosheet transistor 110 (e.g., 138D, 1902, 136D). An isolated view of a multi-segmented inner spacer 606 of the nFET nanosheet transistor 140 is shown in FIG. 1B. The multi-segmented inner spacer 606 is formed, according to embodiments of the invention, to include a central inner spacer body 604, a bottom inner spacer region 138C, and a top inner spacer region 139C, configured and arranged as shown. In some embodiments of the invention, the multi-segmented inner spacer 606 can include only one of the buffer/diffusion barrier end regions 138C, 139C.

In embodiments of the invention, after central portions of the buffer/diffusion barrier layers 132A, 134A, 136A, 138A, 139A have been released from the channel nanosheets 122A, 124A, 126A, the remaining buffer/diffusion barrier end regions 132C, 134C, 136C, 138C, 139C provide additional protection at the edges of the Si nanosheet channels 122A, 124A, 126A against attack from other downstream fabrication processes, which provides further protection against the creation of nanosheet channel voids that can result in shorts (e.g., from source/drain through the gate). Similarly, after central portions of the buffer/diffusion barrier layers 132B, 134B, 136B, 138B, 139B have been released from the channel nanosheets 114B, 116B, 118B, the remaining buffer/diffusion barrier end regions 132D, 134D, 136D, 138D, 139D provide additional protection at the edges of the SiGe nanosheet channels 114B, 116B, 118B against attack from other downstream fabrication processes, which provides further protection against the creation of nanosheet channel voids that can result in shorts (e.g., from source/drain through the gate).

Without benefit of the fabrication operations and resulting structures of the present invention, Si nanosheet layers would abut SiGe nanosheet layers in the nanosheet GAA transistor, and downstream high-thermal-budget fabrication operations would unintentionally (and undesirably) diffuse Ge from the SiGe nanosheet layers into abutting Si nanosheet layer(s). As a result of the unwanted diffusion, regions of the Si channel nanosheets would be converted to SiGe, and regions of the Ge percentage in the SiGe channel nanosheets would be decreased below the selected Ge percentage. The unwanted SiGe regions in the Si channel nanosheets would be attacked and at least partially removed during release (or etching) of the sacrificial nanosheet layers 114, 116, 118, thereby causing channel voids, which can result in shorts (e.g., from source/drain through the gate). Similarly, the unwanted reduced Ge percentage regions (not shown) in the SiGe channel nanosheets 122A, 124A, 126A could result in performance characteristics outside the targeted performance ranges.

Figure 2:
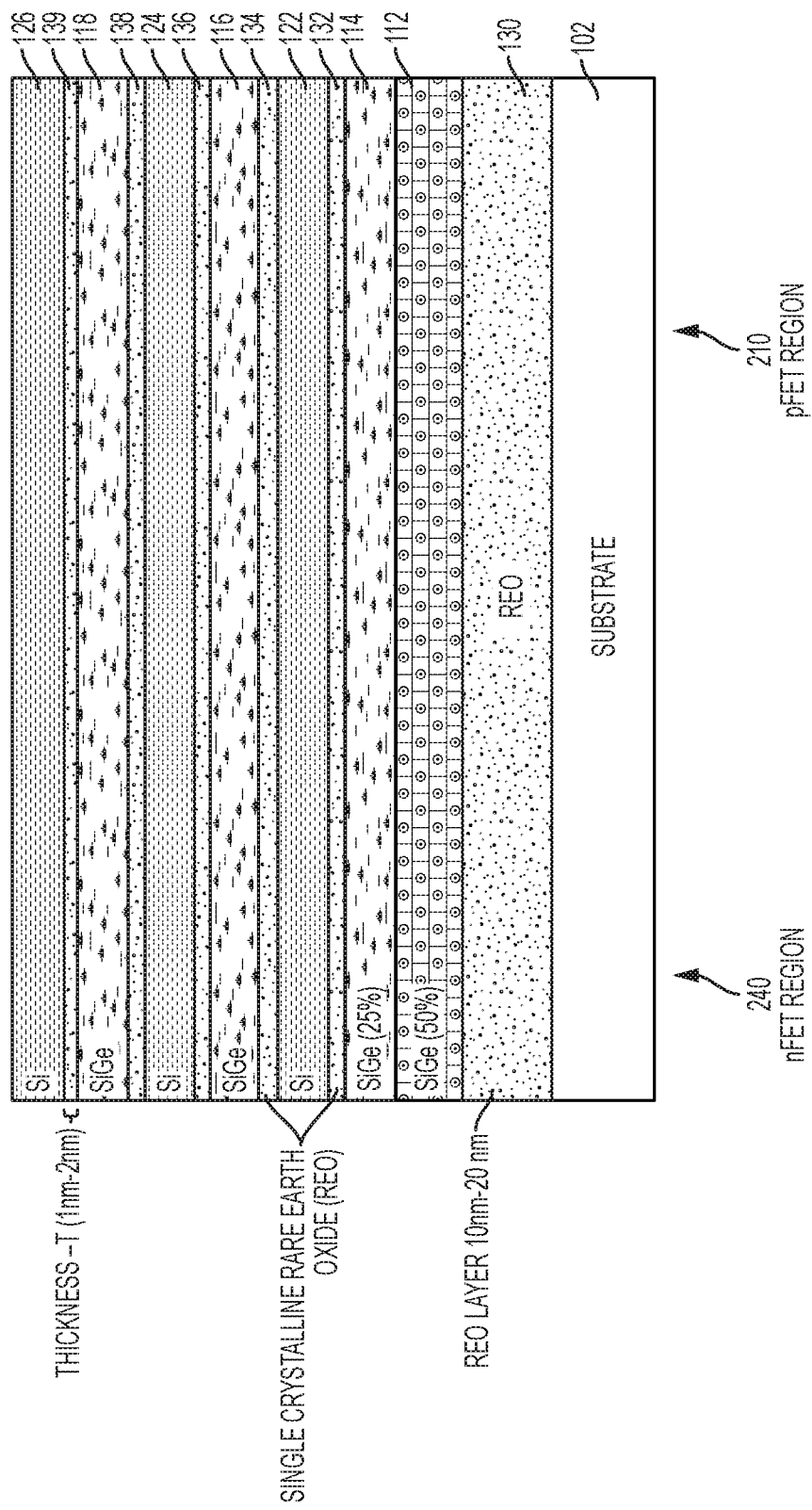

Turning now to a more detailed description of fabrication operations according to aspects of the invention, FIGS. 2-19 depict cross-sectional views of the section 100 of the substrate/wafer 102 (shown in FIG. 1A) after various fabrication operations to form the nFET nanosheet transistor 140 and the pFET nanosheet transistor 110 on the same substrate 102. As shown in FIG. 2, after initial stages of the described fabrication processes, the nFET region 240 and the pFET region 210 are the same. As shown in FIG. 2, a relatively thick (e.g., from about 10 nm to about 20 nm) REO layer 130 is formed over the substrate 102, and a relatively thick (e.g., from about 10 nm to about 50 nm) SiGe 50% nanosheet layer 112 is formed over the REO layer 130. The notation "SiGe 50%" is used to indicate that 50% of the SiGe material is Ge. An alternating series of SiGe nanosheet layers 114, 116, 118, REO buffer/diffusion nanosheet layers 132, 134, 136, 138, 139, and Si nanosheet layers 122, 124, 126 are formed in a stack on the SiGe 50% nanosheet layer 112. In embodiments of the invention, the SiGe nanosheet layers 114, 116, 118 are SiGe 25%.

In embodiments of the invention, the alternating nanosheet layers depicted in FIG. 2 can be formed by epitaxially growing one layer and then the next until the desired number and desired thicknesses of the nanosheet layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 3:
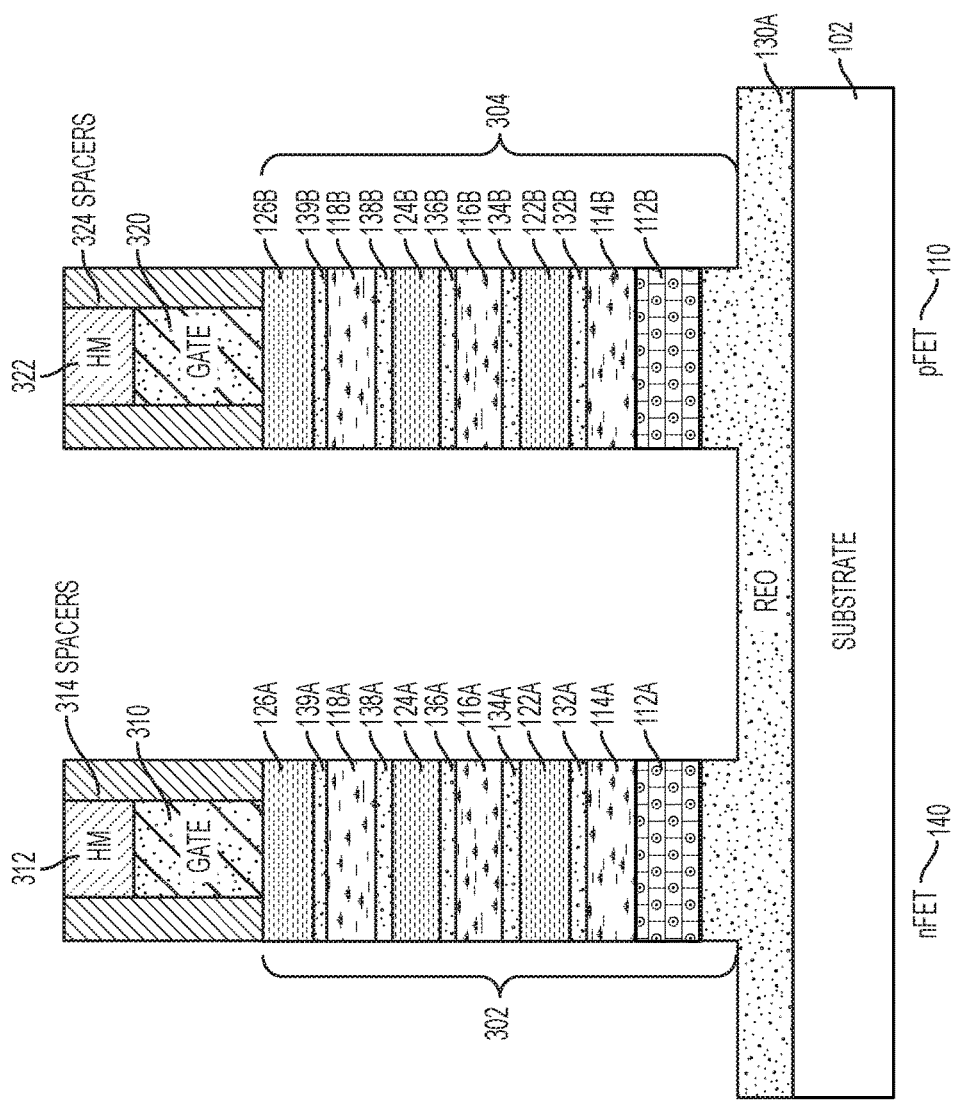

As shown in FIG. 3, known semiconductor fabrication operations have been used to form fin-shaped columns 302, 304 having dummy gates 310, 320, gate spacers 314, 324, and hard masks 312, 322 formed on and around the columns 302, 304. For example, known semiconductor fabrication operations can be used to pattern and etch (or recess) the alternating nanosheet layers 112, 114, 132, 122, 134, 116, 136, 124, 138, 118, 139, 126 to form fin-shaped columns 302, 304. Although two fin-shaped columns 302, 304 are shown in the two-dimensional (X-axis and Y-axis) diagram shown in FIG. 3, multiple additional fin-shaped columns (not shown) are positioned behind the columns 302, 304 and extend into the page in the Y-axis direction. The additional fin-shaped columns positioned behind the columns 302, 304 are substantially the same as the fin-shaped columns 302, 304. The etch (or recess) operations that form the fin-shaped columns 302, 304 are configured to stop into the REO nanosheet layer 130 (shown in FIG. 2), which results in the REO nanosheet region 130A. Accordingly, in addition to providing bottom isolation for the nFET nanosheet transistor 140 and the pFET transistor 110, the REO nanosheet layer 130 (or 130A) also functions as an etch/recess-stop for the etch/recess processes used to form the fin-shaped columns 302, 304.

Each of the fin-shaped columns 302 includes a SiGe 50% region 112A and a stack of alternating SiGe/REO/Si/regions 114A, 132A, 122A, 134A, 116A, 136A, 124A, 138A, 118A, 139A, 126A. Similarly, each of the fin-shaped columns 304 includes a SiGe 50% region 112B and a stack of alternating SiGe/REO/Si regions 114B, 132B, 122B, 134B, 116B, 136B, 124B, 138B, 118B, 139B, 126B.

In an example fabrication process for forming the fin-shaped columns 302, 304, a patterned hard mask (not shown) is deposited over the alternating nanosheet layers shown in FIG. 2. The pattern of the hard mask defines a series of elongated columns (or fins). An etch (e.g., an RIE) or a recess is applied to remove the portions of the alternating nanosheet layers that are not covered by the patterned hard mask, thereby forming multiple intermediate elongated columns/fins (not shown) in the alternating nanosheet layers shown in FIG. 2. The etch or recess that is applied to form the final fin-shaped columns 302, 304 from the intermediate elongated columns is stopped at a level that is into the REO region 130A. Accordingly, the REO region 130A acts as an etch/recess-stop for the etch/recess process that forms the final fin-shaped columns 302, 304. Through subsequent fabrication processes described below, the intermediate elongated columns are further patterned and etched/recessed (e.g., as part of the dummy gate and gate spacer formation process) to form the final fin-shaped columns 302, 304.

The dummy gates 310, 320 and offset gate spacers 314, 320 can be formed after formation of the above-described intermediate elongated columns/fins, and the offset gate spacers 314, 324 can be used to define and etch the final fin-shaped columns 302, 304 from the intermediate elongated columns. For example, the dummy gates 310, 320 can be formed by depositing amorphous silicon (a-Si) over and around the intermediate elongated columns. The a-Si is then planarized to a desired level. A hard mask layer (not shown) is deposited over the planarized a-Si and patterned to form the hard masks 312, 322. In embodiments of the invention, the hard masks 312, 322 can be formed from a nitride or an oxide layer. An etching process (e.g., an RIE) is applied to the a-Si to form the dummy gates 310, 320.

The offset gate spacers 314, 324 are formed along the dummy gates 310, 320, and then an etch or a recess is applied to the intermediate elongated columns to define and form the final fin-shaped column 302, 304. The offset spacers 314, 324 can be formed using a spacer pull down formation process. The offset spacers 314, 324 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE). The etch or recess that is applied to form the final fin-shaped columns 302, 304 from the intermediate elongated columns is stopped at a level that is into the REO region 130A. Accordingly, the REO region 130A acts as an etch/recess-stop for the etch/recess process that forms the final fin-shaped columns 302, 304.

Figure 4:
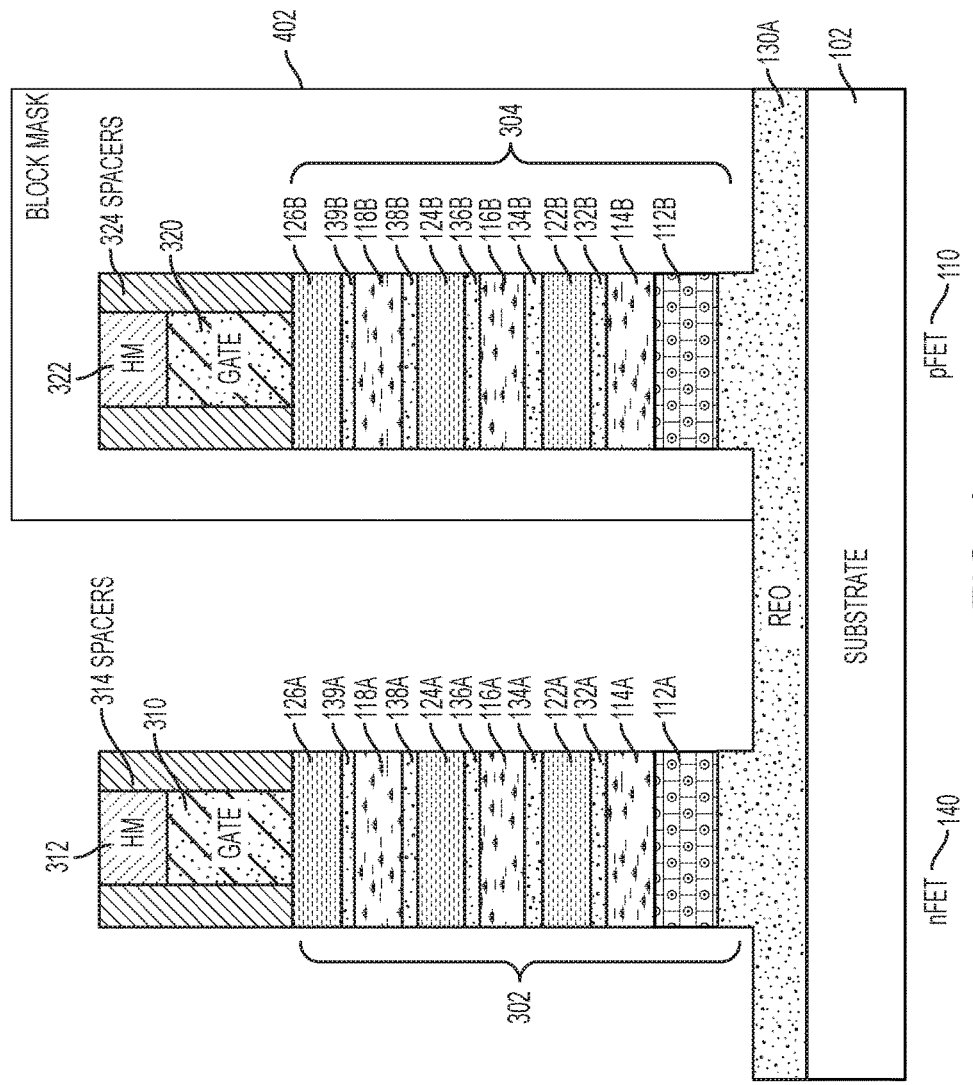
Figure 5:
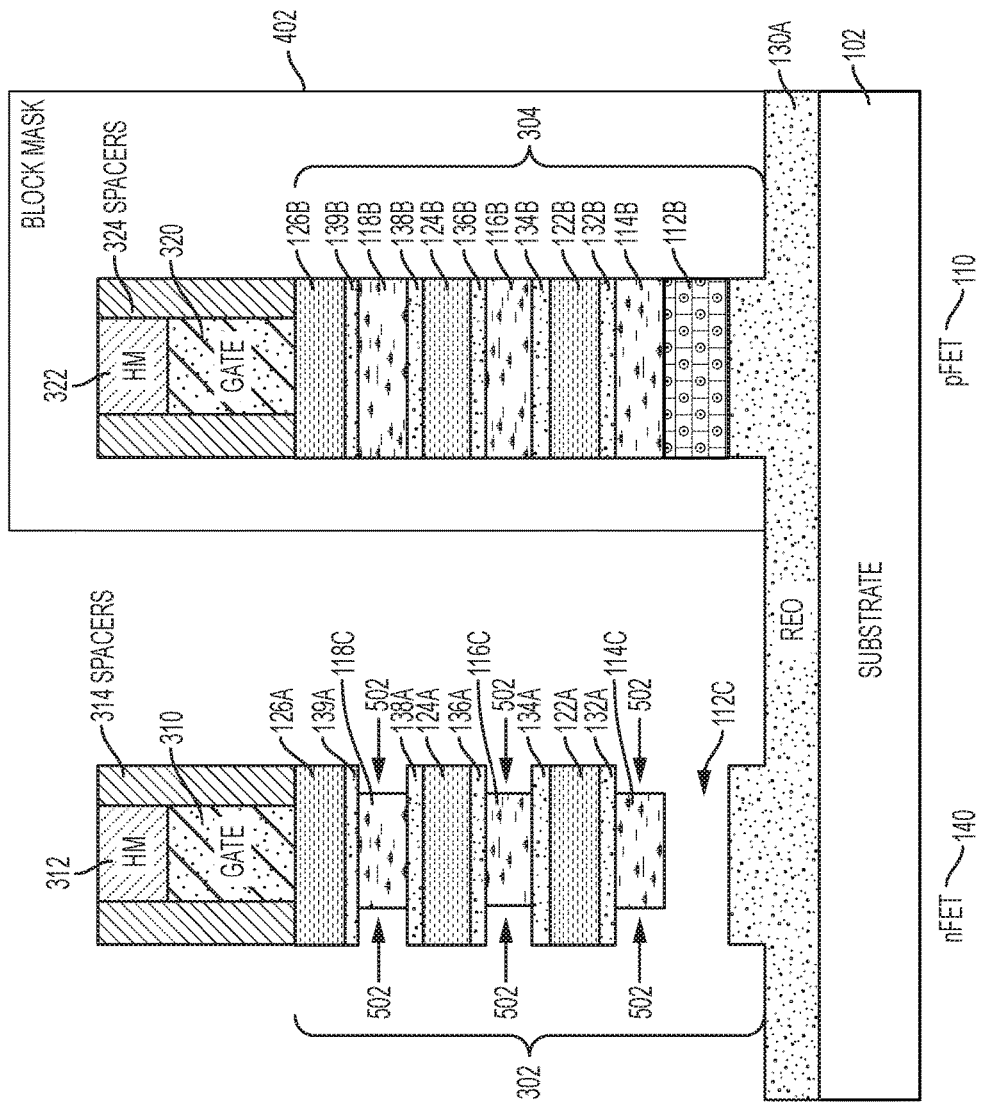

In FIG. 4, a block mask 402 has been deposited to cover the pFET 110 but not cover the nFET 140. In FIG. 5, known semiconductor fabrication processes have been used to remove the SiGe 50% region 112A (shown in FIG. 4), thereby forming a cavity region 112C. Additionally, known semiconductor fabrication processes have been used to form pull back end region cavities 502 in the SiGe sacrificial nanosheet regions 114A, 116A, 118A (shown in FIG. 4) from underneath the offset gate spacers 314 using, for example, a hydrogen chloride (HCL) gas isotropic etch process, which etches SiGe without attacking Si or the selected REO material. After formation of the end region cavities 502, sacrificial nanosheet central regions 114C, 116C, 118C remain.

Figure 6:
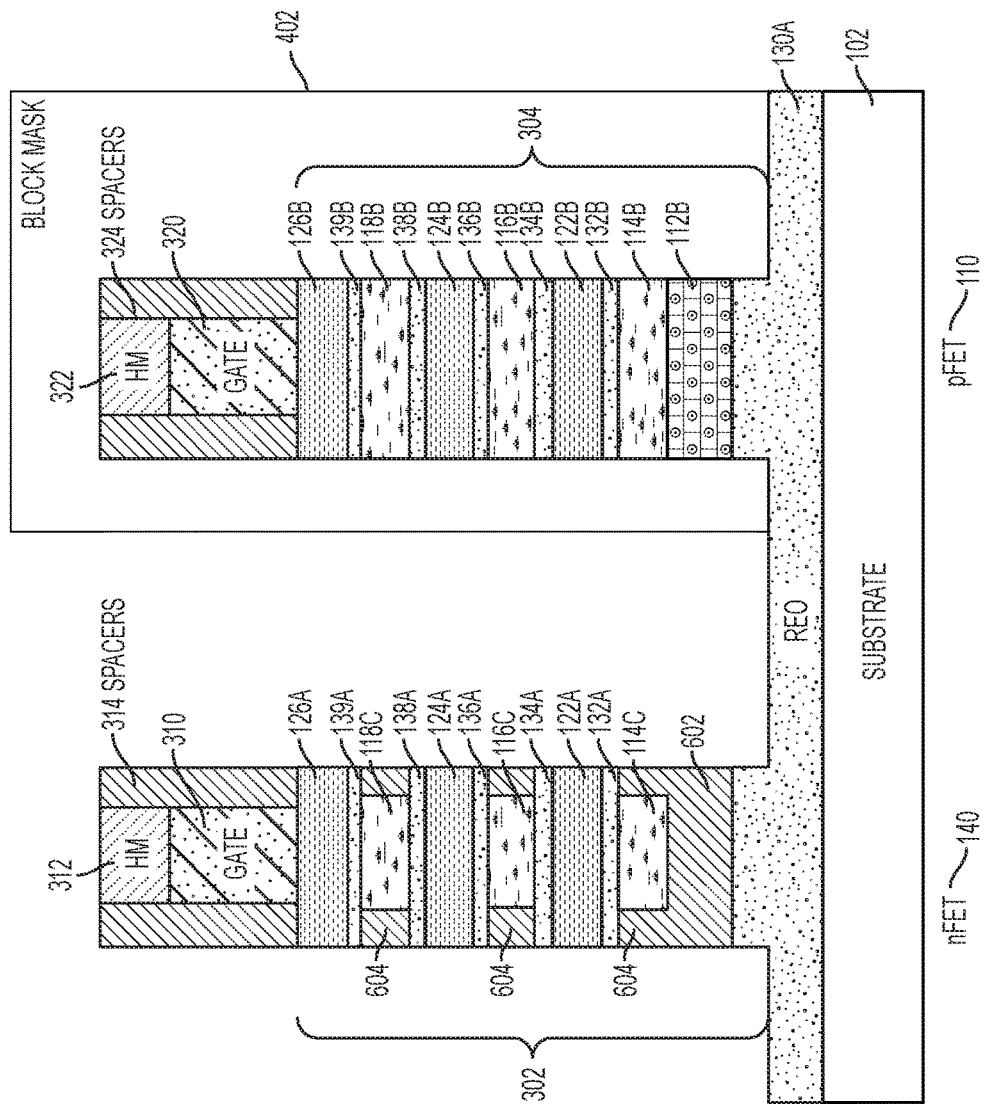

In FIG. 6, known semiconductor device fabrication processes have been used to form inner spacers 604 in the cavities 502. Additionally, known semiconductor fabrication processes have been used to form a bottom spacer 602 in the cavity 112C. In embodiments of the invention, the inner spacers can be formed by conformally depositing a dielectric to fill the cavities 502. The deposited dielectric can be isotropically etched back to remove enough of the dielectric to expose Si nanosheet ends and the bottom exposed REO surface so that epitaxy can be performed to form the source/drain regions (702, 704 shown in FIG. 7). The spacer material can be, for example, silicon nitride, silicon oxide, silicon dioxide, silicon oxynitride, SiCN, SiOCN, SiOC, SiBCN, a dielectric metal oxide, a dielectric metal nitride, or a combination thereof. In embodiments of the invention, the bottom spacer 602 and the inner spacers 604 can be formed from a nitride-based material.

Figure 7:
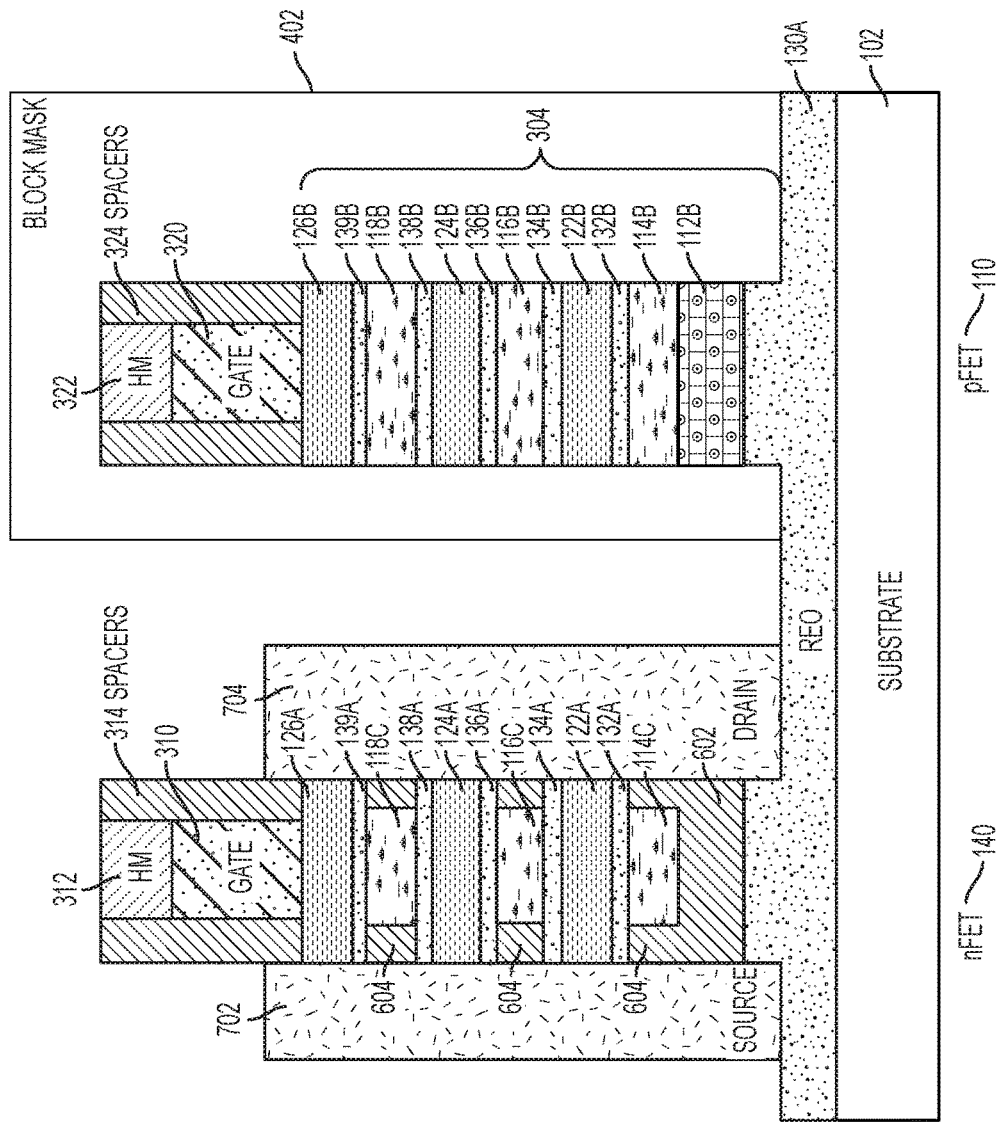

In FIG. 7, known semiconductor device fabrication processes have been used to form raised source/drain (S/D) regions 702, 704. In embodiments of the invention, the raised S/D regions 702, 704 are formed using an epitaxial layer growth process on the exposed ends of the Si channel nanosheets 122A, 124A, 126A. In some embodiments of the invention, the raised S/D region 702, 704 can also be grown from exposed surfaces of the REO region 130A where the REO is a single crystalline material. In embodiments of the invention, the epitaxial growth of the raised S/D regions 702, 704 is also from exposed ends of the buffer/diffusion regions 132A, 134A, 136A, 138A, 139A where the buffer/diffusion regions 132A, 134A, 136A, 138A are single crystalline REO material. In-situ doping (ISD) is applied to form doped S/D regions 702, 704, thereby creating the necessary junctions of the nFET 140 semiconductor device. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

Figure 8:
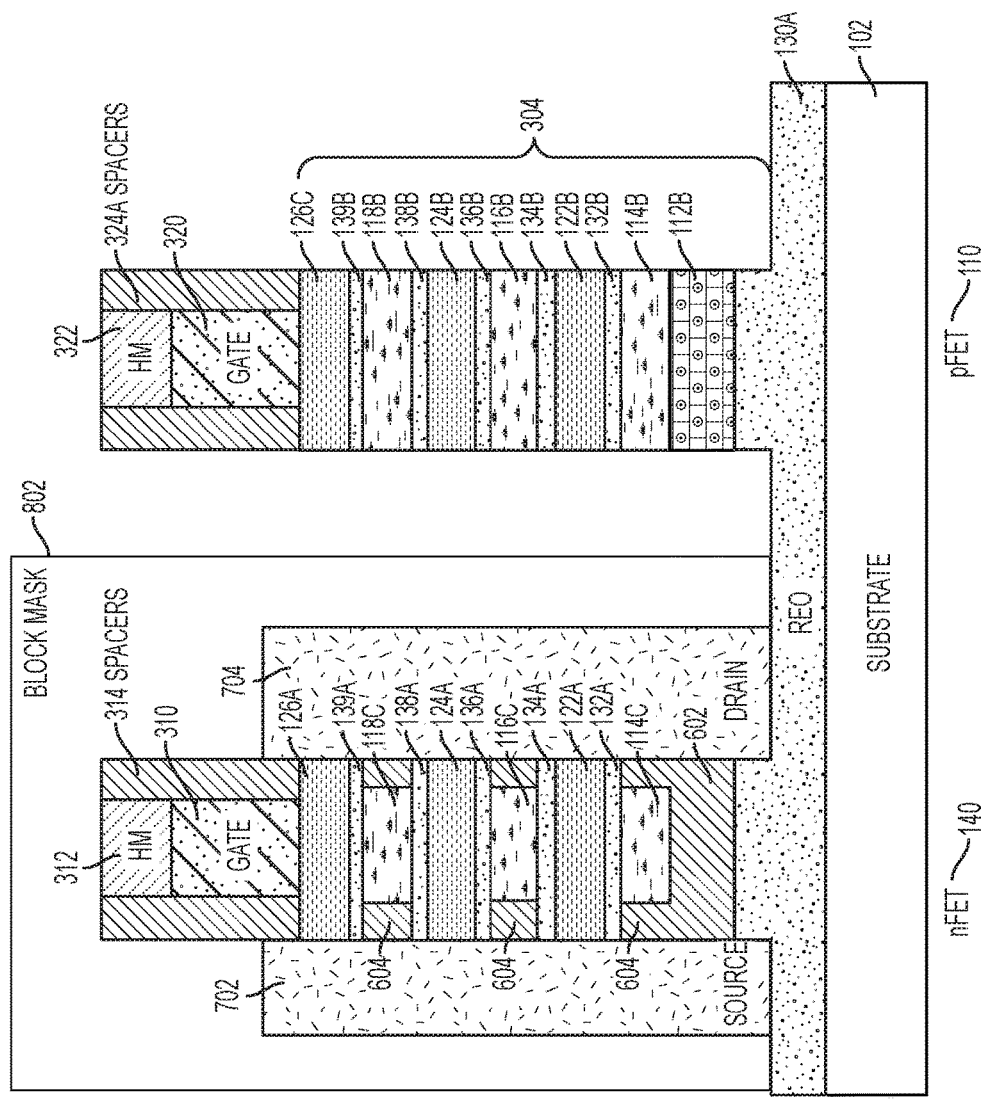
Figure 9:
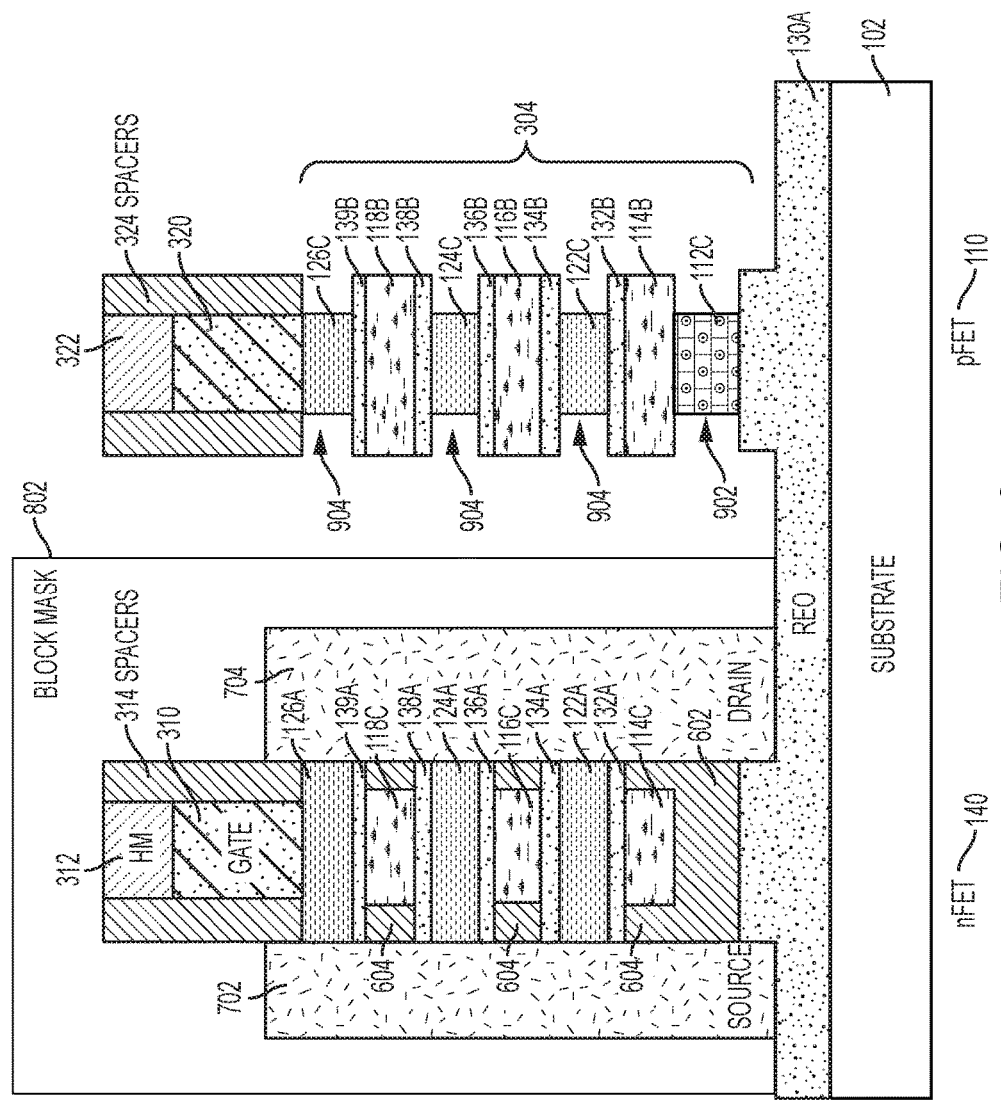

In FIG. 8, the block mask 402 has been removed, and a block mask 802 has been deposited to cover the nFET 140 but not cover the pFET 110. In FIG. 9, known semiconductor fabrication processes have been used to form pull back end region cavities 902 in the SiGe 50% sacrificial nanosheet region 112B (shown in FIG. 8) from underneath the offset gate spacers 324. Additionally, known semiconductor fabrication processes have been used to form pull-back end region cavities 904 in the Si sacrificial nanosheet regions 122B, 124B, 126B (shown in FIG. 9) underneath the offset gate spacers 324 using, for example, an etch process that etches Si without attacking SiGe or the selected REO material. After formation of the end region cavities 902, 904, a sacrificial SiGe 50% nanosheet central region 112C and sacrificial Si nanosheet regions 122C, 124C, 126C remain.

Figure 10:
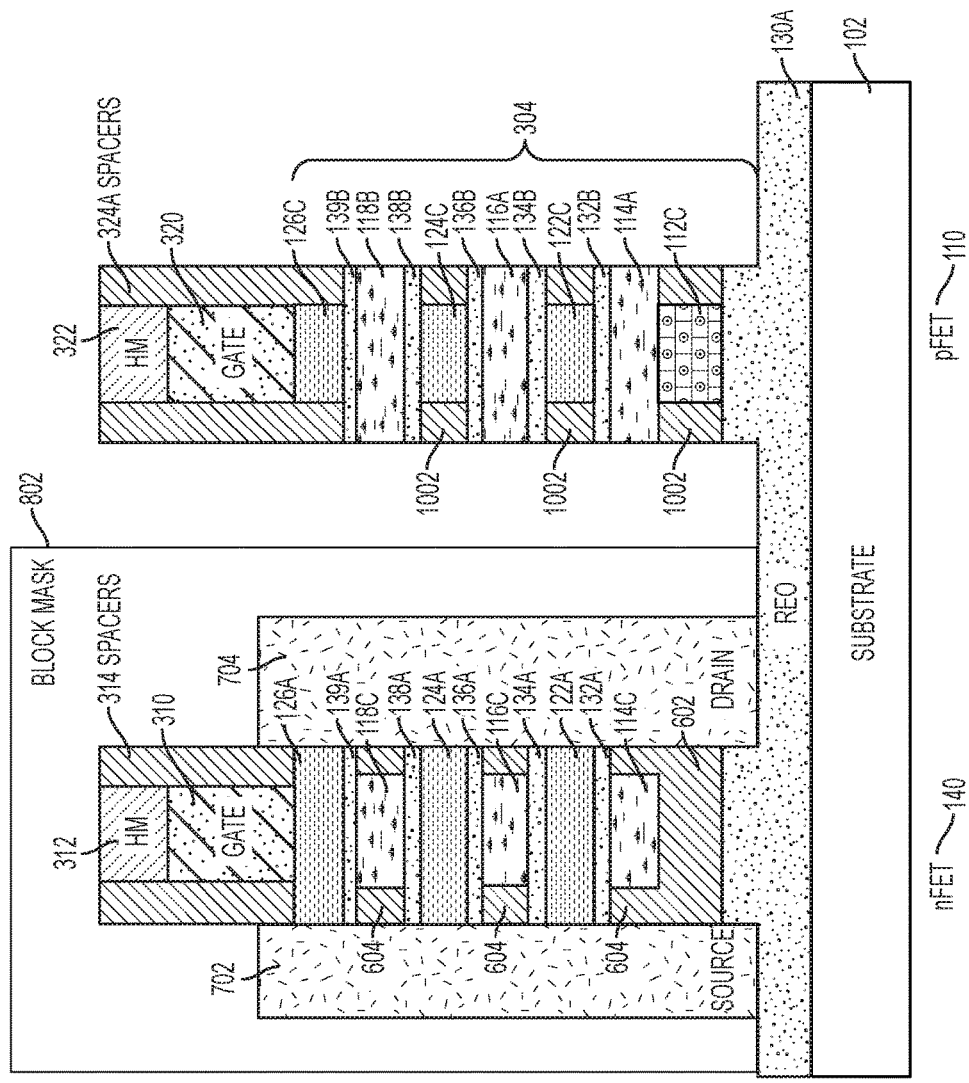

In FIG. 10, known semiconductor device fabrication processes have been used to form inner spacers 1002 in the cavities 902, 904. The topmost inner spacers are formed immediately below the gate spacers 324 (shown in FIG. 9). Accordingly, the combined gate spacers and topmost inner spacers are depicted in FIG. 10 as gate spacers 324A. In embodiments of the invention, the inner spacers 1002 can be formed from a nitride-based material.

Figure 11:
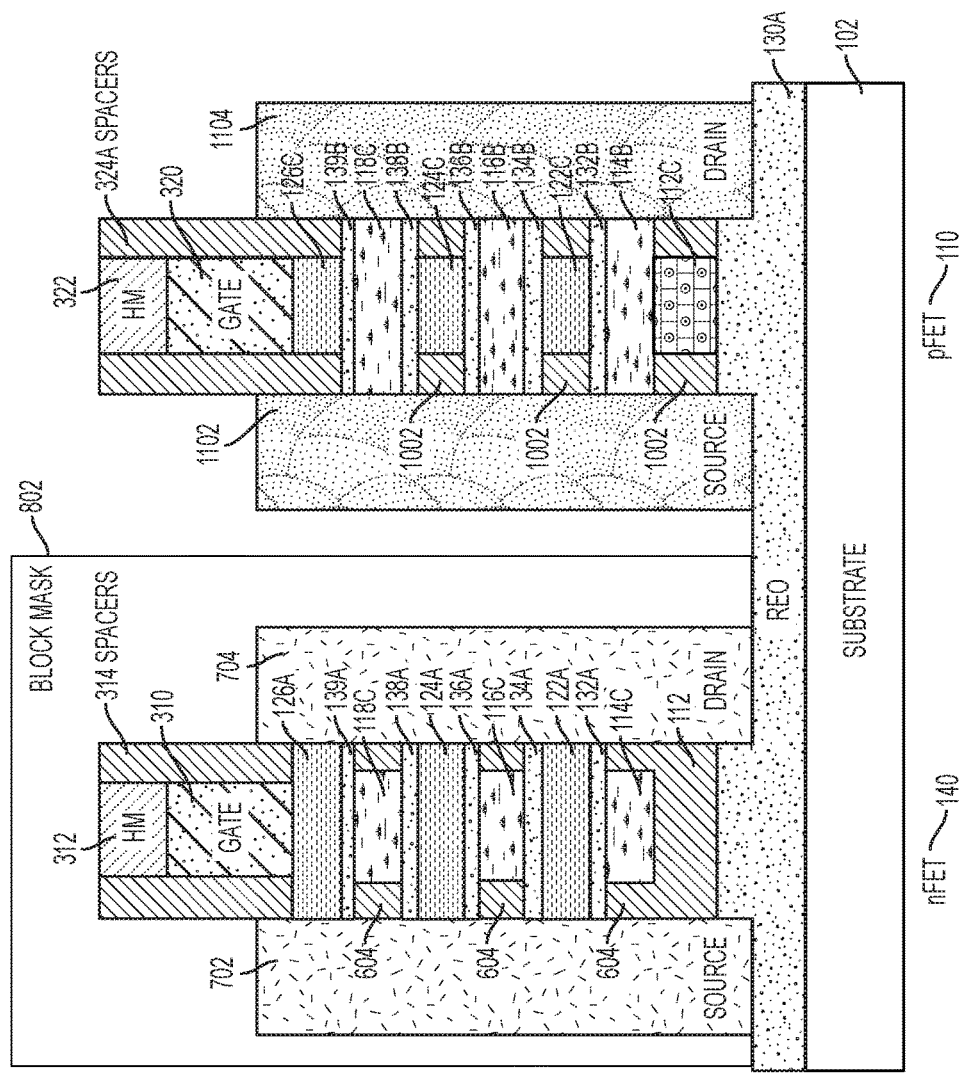

In FIG. 11, known semiconductor device fabrication processes have been used to form raised source/drain (S/D) regions 1102, 1104. In embodiments of the invention, the raised S/D regions 1102, 1104 are formed using an epitaxial layer growth process on the exposed ends of the SiGe channel nanosheets 114B, 116B, 118B. In some embodiments of the invention, the raised S/D region 1102, 1104 can also be grown from exposed surfaces of the REO region 130A where the REO is a single crystalline material. In embodiments of the invention, the epitaxial growth of the raised S/D regions 1102, 1104 is also from exposed ends of the buffer/diffusion regions 132B, 134B, 136B, 138B, 139B where the buffer/diffusion regions 132B, 134B, 136B, 138B are single crystalline REO material. In-situ doping (ISD) is applied to form doped S/D regions 1102, 1104, thereby creating the necessary junctions of the pFET 110 semiconductor device. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

Figure 12:
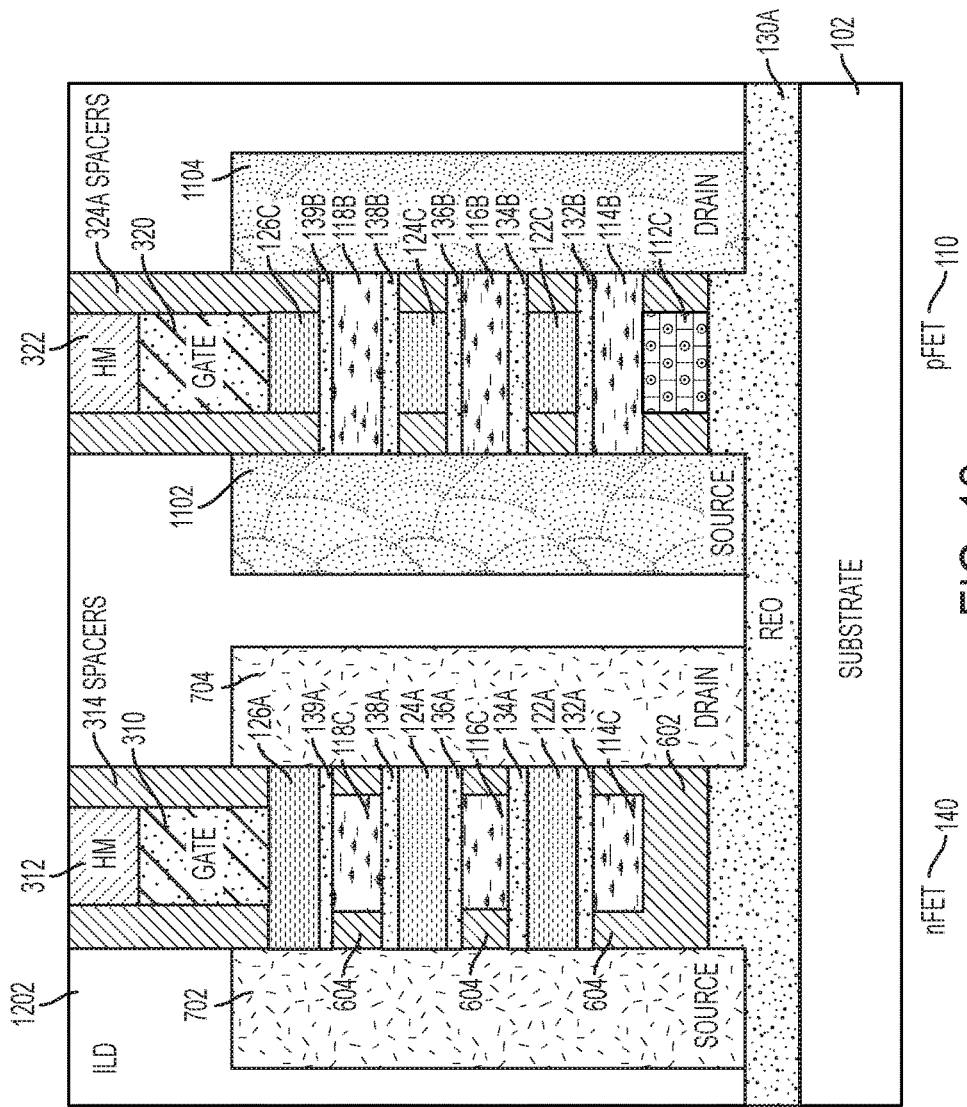

In FIG. 12, the block mask 802 has been removed, and known semiconductor fabrication operations have been used to form an interlayer dielectric (ILD) region 1202. The ILD region 1202 can be formed by depositing an oxide material in bulk (e.g., silicon dioxide) and polishing the bulk oxide back (e.g., using CMP) to the level of the gate spacers 314, 324A and the hard masks 312, 322.

Figure 13:
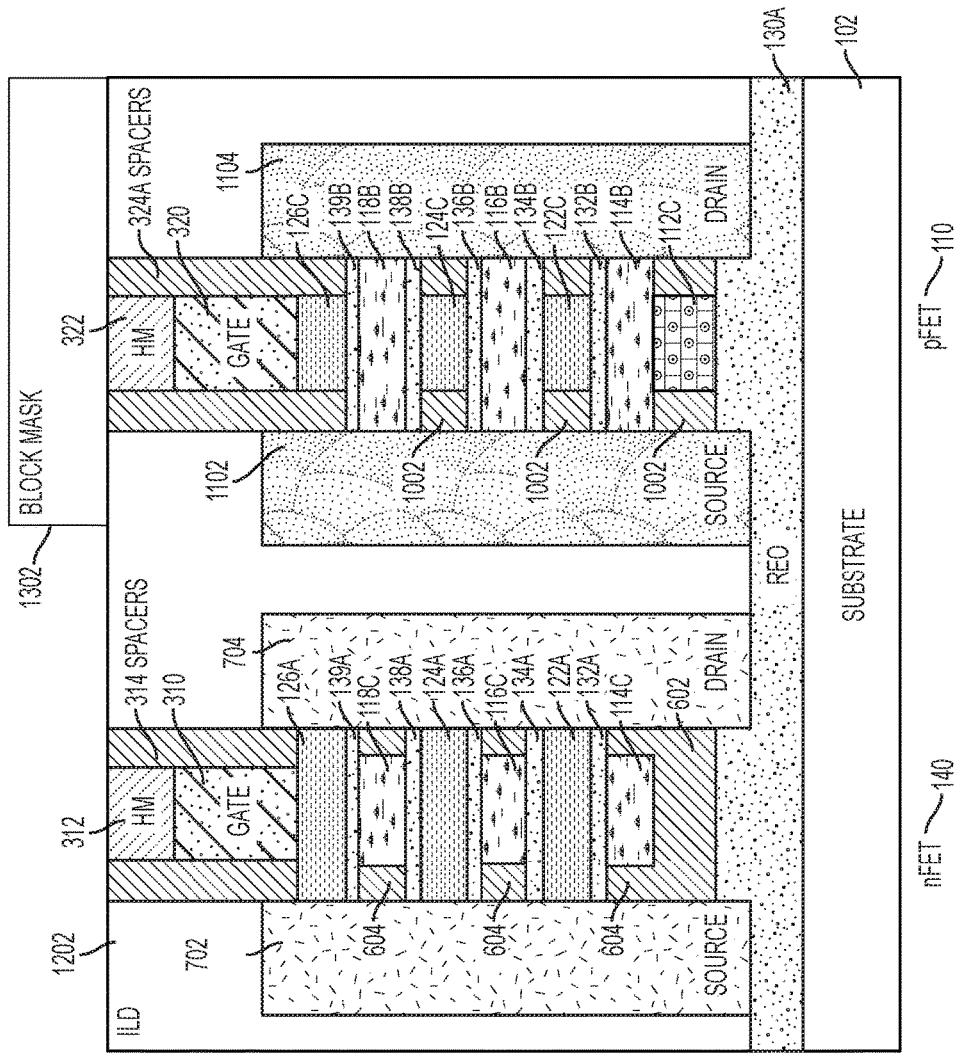
Figure 14:
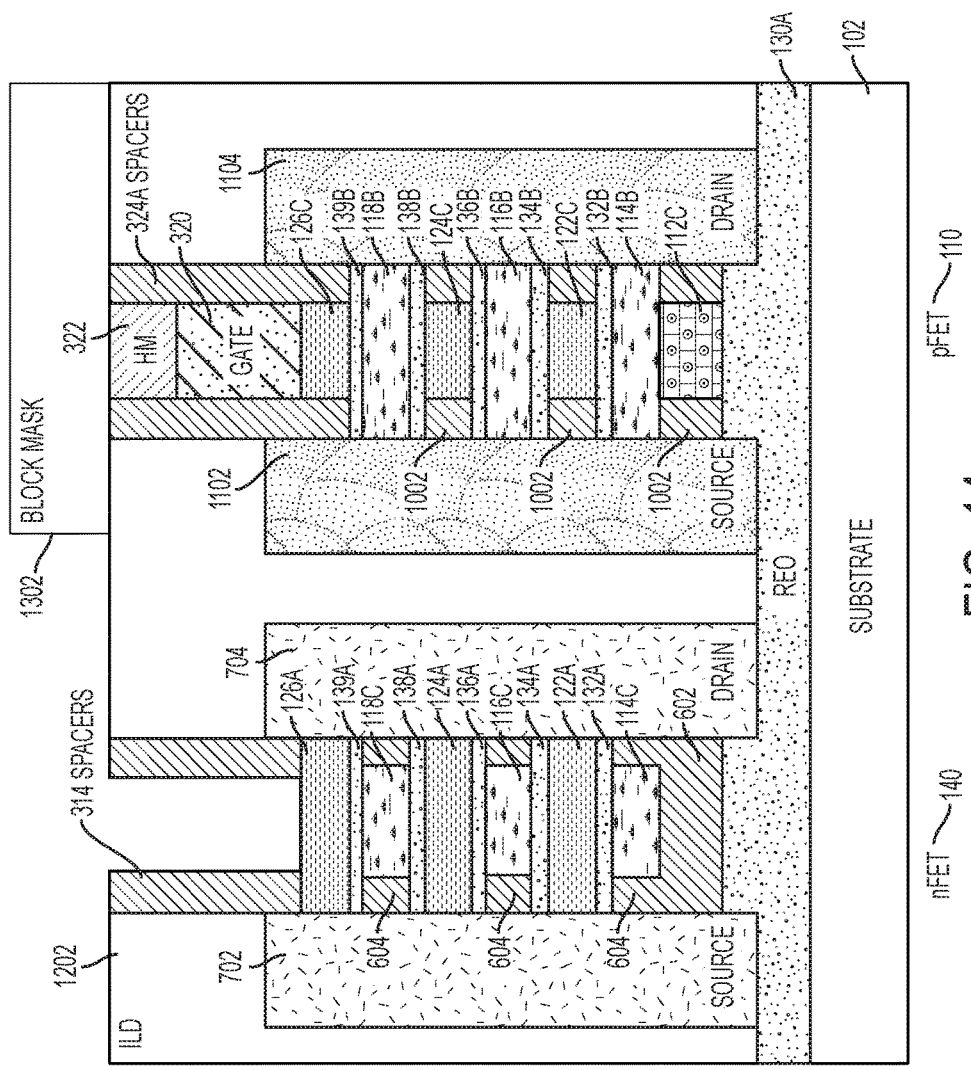

In FIG. 13, a block mask 1302 has been deposited to cover the pFET 110 but not cover the nFET 140. In FIG. 14, the dummy gate 310 and the hard mask 312 have been removed. The dummy gate 310 and the hard mask 312 can be removed by a known etching process, e.g., one or more of a dry etch process (e.g., a reactive ion etch (RIE), plasma etching, or the like) and a wet etch process using phosphoric acid ($H_3PO_4$).

Figure 15:
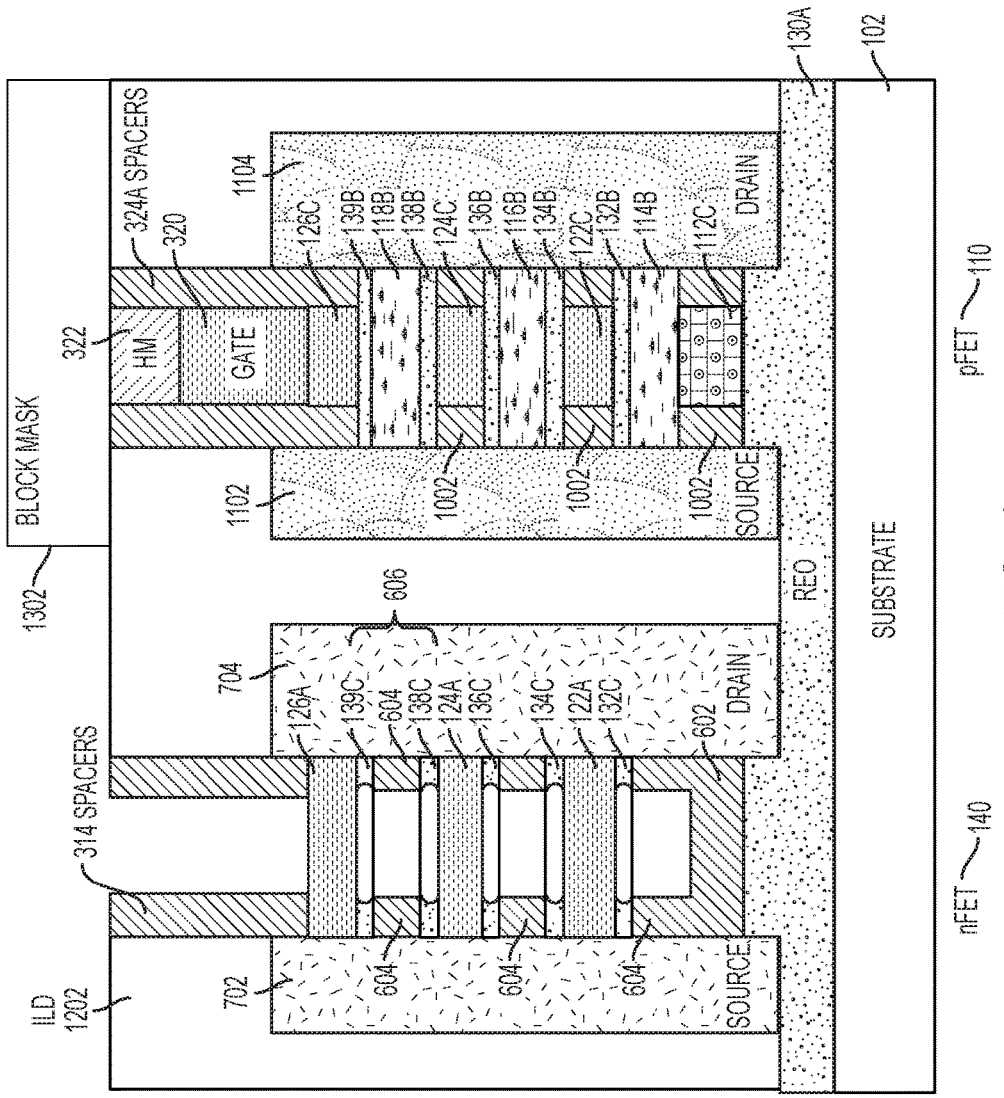

In FIG. 15, known semiconductor fabrication operations have been used to remove the SiGe sacrificial nanosheet central regions 114C, 116C, 118C (shown in FIG. 14) and central regions of the buffer/diffusion regions 132A, 134A, 136A, 138A, 139A (shown in FIG. 14). In embodiments of the invention, the SiGe sacrificial nanosheet central regions 114C, 116C, 118C can be removed by applying a selective etch (e.g., a hydrochloric acid (HCl)). In embodiments of the invention, the central regions of the buffer/diffusion regions 132A, 134A, 136A, 138A, 139A can be removed by applying a selective etch that is selected based on the particular REO used to form the central regions of the buffer/diffusion regions 132A, 134A, 136A, 138A, 139A. After removal of the central regions of the buffer/diffusion regions 132A, 134A, 136A, 138A, 139A, buffer/diffusion end regions 132C, 134C, 136C, 138C, 139C remain. Accordingly, after the above described fabrication operations, multi-segmented inner spacers (e.g., multi-segmented inner spacer 606) have been formed in the nFET 140. An isolated view of the multi-segmented inner spacer 606 is shown in FIG. 1B. The multi-segmented inner spacer 606, according to embodiments of the invention, to include a central inner spacer body 604 (inner spacer 604), a bottom inner spacer region 138C (buffer/diffusion end region 138C), and a top inner spacer region 139C (buffer/diffusion end region 139C), configured and arranged as shown.

In embodiments of the invention, the buffer/diffusion barrier end regions 132C, 134C, 136C, 138C, 139C provide additional protection at the edges of the Si nanosheet channels 122A, 124A, 126A against attack from various fabrication processes, which provides further protection against the creation of nanosheet channel voids that can result in shorts (e.g., from source/drain through the gate). For example, where the selectivities of the SiGe/REO etches used to remove the SiGe sacrificial nanosheet central regions 114C, 116C, 118C and the central regions of the buffer/diffusion regions 132A, 134A, 136A, 138A, 139A are based on a slower etch rate for Si than SiGe/REO, there is still some possibility that the SiGe/REO etches can (e.g., through prolonged exposure) have some impact on the Si channel nanosheets 122A, 124A, 126A. Accordingly, the presence of the buffer/diffusion end regions 132C, 134C, 136C, 138C, 139C can provide additional protection against the Si channel nanosheet regions 122A, 124A, 126A being impacted by the SiGe/REO selective etches used to remove the SiGe sacrificial nanosheet central regions 114C, 116C, 118C and the central regions of the buffer/diffusion regions 132A, 134A, 136A, 138A, 139A.

Figure 16:
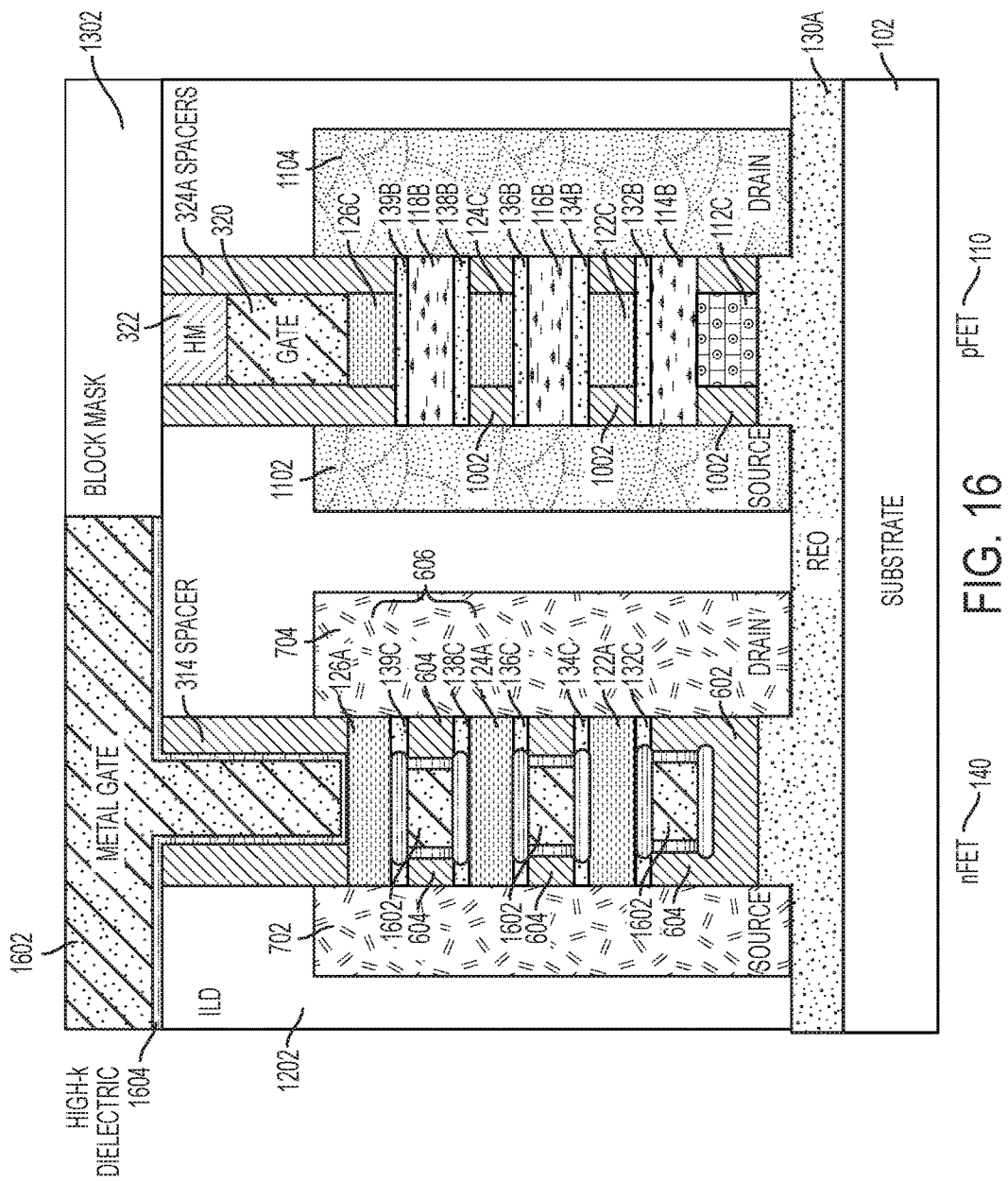

In FIG. 16, known semiconductor fabrication processes (e.g., a gate-late fabrication process) have been used to replace the removed dummy gate 310 and the hard mask 312 with a multi-segmented metal gate structure 1602 and gate dielectric layer 1604. The gate dielectric material can be silicon oxide, silicon nitride, silicon oxynitride, boron nitride, SiOCN, SiBCN, SiOC, SiCN, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. The gate dielectric can be deposited by CVD, ALD, or any other suitable technique. In embodiments of the invention, the HK dielectric layer 1604 can be formed from a hafnium-based material. In embodiments of the invention, the replacement metal gate structure 1602 can include work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). The multi-segmented metal gate structure 1602 and the high-k (HK) dielectric layer 1604 surround the stacked Si nanosheet channel regions 122A, 124A, 126A and regulate electron flow through the Si nanosheet channel regions 122A, 124A, 126A between the source 702 and the drain 704.

Figure 17:
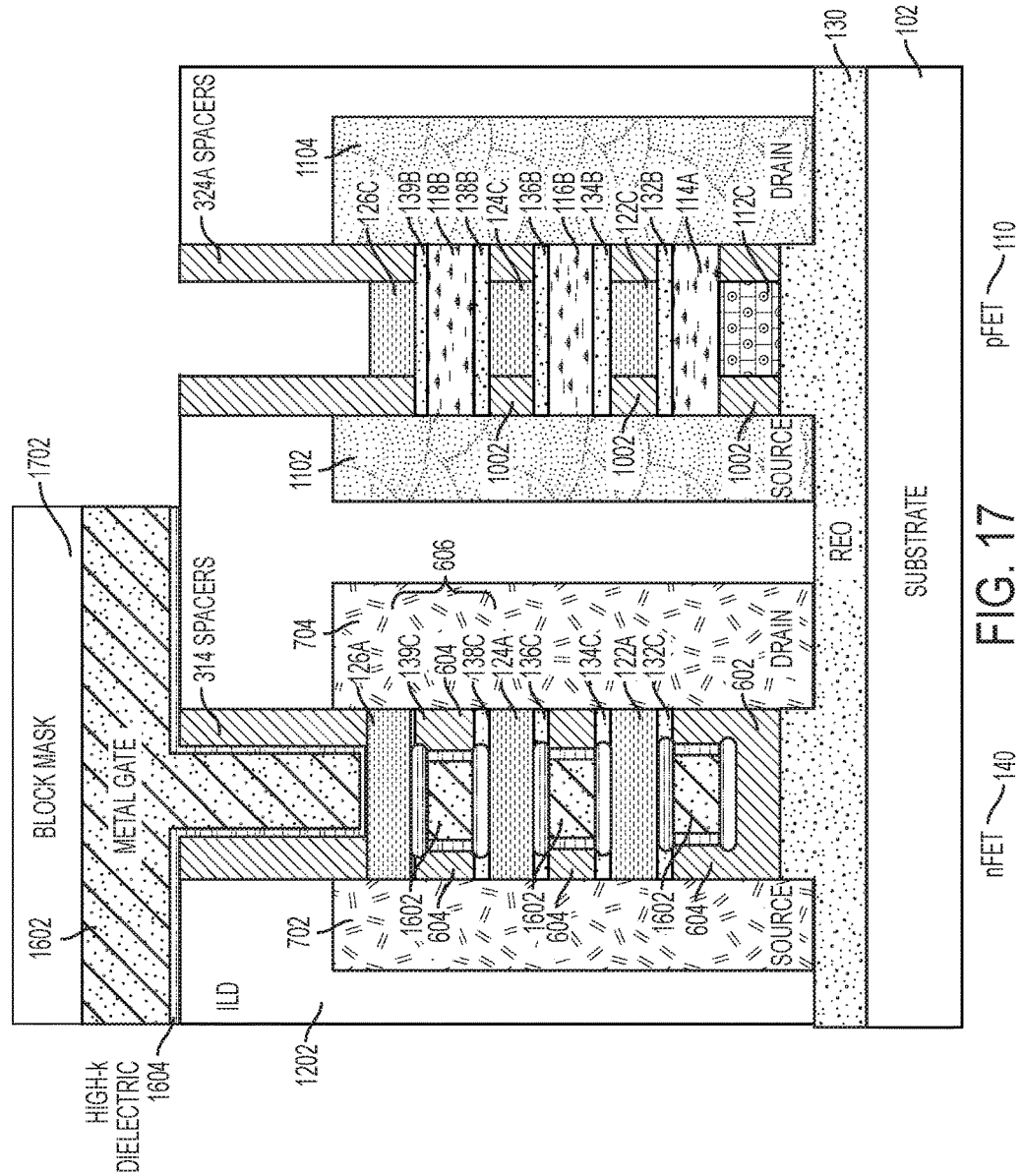

In FIG. 17, the block mask 1302 has been removed; a block mask 1702 has been deposited to cover the nFET 140 but not cover the pFET 110; and the dummy gate 320 and the hard mask 322 have been removed. In embodiments of the invention, the dummy gate 320 and the hard mask 322 can be removed by a known aforementioned etching process.

Figure 18:
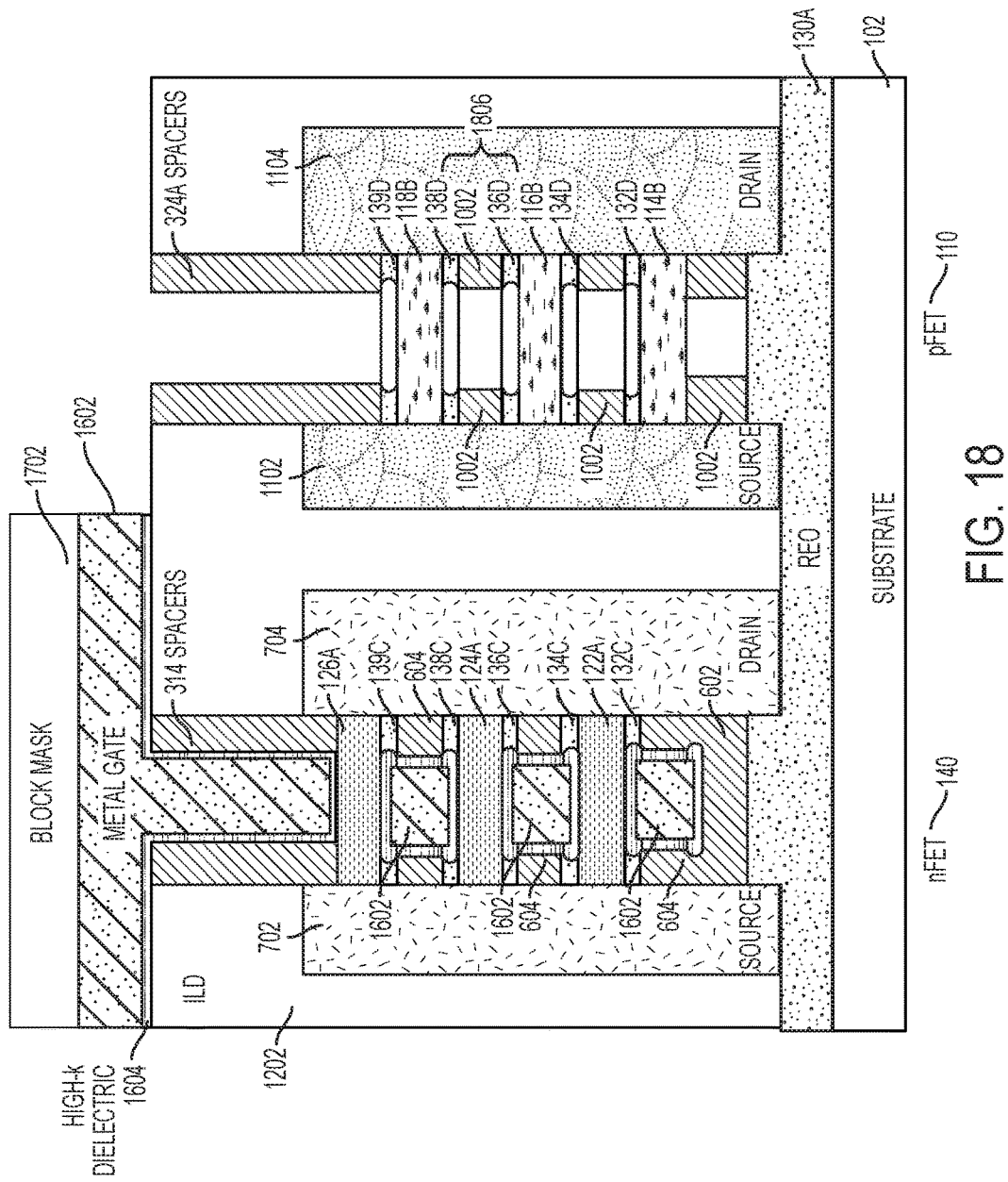

In FIG. 18, known semiconductor fabrication operations have been used to remove the SiGe 50% sacrificial nanosheet central region 112B (shown in FIG. 17), the Si sacrificial nanosheet central regions 122B, 124B, 126B (shown in FIG. 17), and central regions of the buffer/diffusion regions 132B, 134B, 136B, 138B, 139B (shown in FIG. 17). In embodiments of the invention, the SiGe 50% sacrificial nanosheet central region 112B can be removed by applying a SiGe selective etch (e.g., a hydrochloric acid (HCl)) while protecting the SiGe channel nanosheets 114B, 116B, 118B. In embodiments of the invention, the Si sacrificial nanosheet central regions 122B, 124B, 126BC can be removed by applying a Si selective etch. In embodiments of the invention, the central regions of the buffer/diffusion regions 132B, 134B, 136B, 138B, 139B can be removed by applying a selective etch that is selected based on the particular REO used to form the central regions of the buffer/diffusion regions 132B, 134B, 136B, 138B, 139B. After removal of the central regions of the buffer/diffusion regions 132B, 134B, 136B, 138B, 139B, buffer/diffusion end regions 132D, 134D, 136D, 138D, 139D remain. Accordingly, after the above described fabrication operations, multi-segmented inner spacers (e.g., multi-segmented inner spacer 1806) have been formed in the pFET 110. An isolated view of the multi-segmented inner spacer 1806 is shown in FIG. 1B. The multi-segmented inner spacer 1806, according to embodiments of the invention, to includes a central inner spacer body 1004 (inner spacer 1004), a bottom inner spacer region 136D (buffer/diffusion end region 136D), and a top inner spacer region 138D (buffer/diffusion end region 138D), configured and arranged as shown.

In embodiments of the invention, the buffer/diffusion barrier end regions 132D, 134D, 136D, 138D, 139D provide additional protection at the edges of the SiGe nanosheet channels 114B, 116B, 118B against attack from various fabrication processes, which provides further protection against the creation of nanosheet channel voids that can result in shorts (e.g., from source/drain through the gate). For example, where the selectivities of the Si/REO etches used to remove the Si sacrificial nanosheet central regions 122C, 124C, 126C and the central regions of the buffer/diffusion regions 132B, 134B, 136B, 138B, 139B are based on a slower etch rate for SiGe than Si/REO, there is still some possibility that the Si/REO etches can (e.g., through prolonged exposure) have some impact on the SiGe channel nanosheets 114B, 116B, 118B. Accordingly, the presence of the buffer/diffusion end regions 132D, 134D, 136D, 138D, 139D can provide additional protection against the SiGe channel nanosheet regions 114B, 116B, 118B being impacted by the Si/REO selective etches used to remove the Si sacrificial nanosheet central regions 122C, 124C, 126C and the central regions of the buffer/diffusion regions 132B, 134B, 136B, 138B, 139B.

Figure 19:
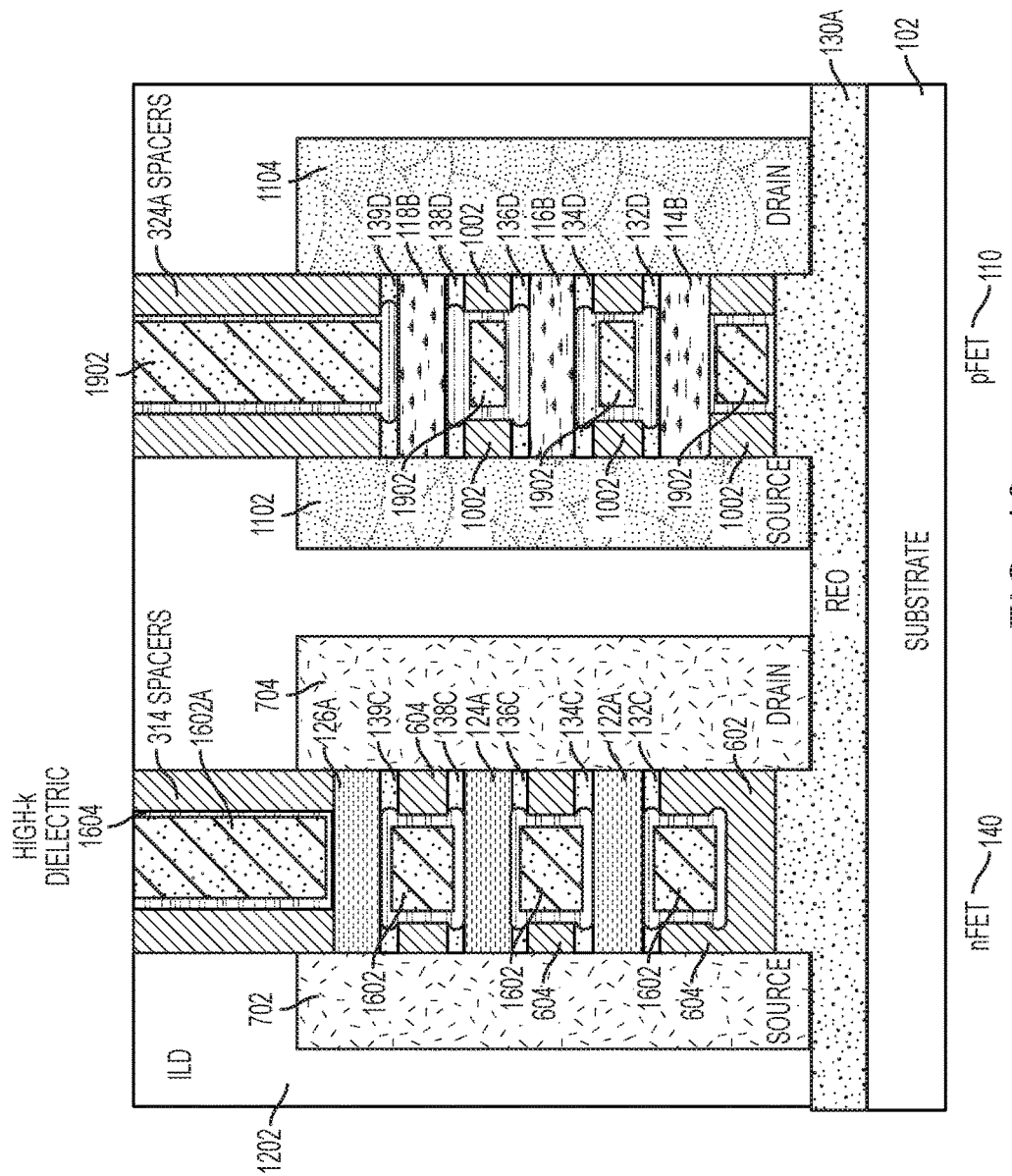

In FIG. 19, known semiconductor fabrication processes (e.g., a gate-late fabrication process) have been used to replace the removed dummy gate 320 and the hard mask 322 with a multi-segmented metal gate structure 1902 and a dielectric layer 1904. The gate dielectric material can be silicon oxide, silicon nitride, silicon oxynitride, boron nitride, SiOCN, SiBCN, SiOC, SiCN, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. The gate dielectric can be deposited by CVD, ALD, or any other suitable technique. In embodiments of the invention, the HK dielectric layer 1904 can be formed from a hafnium-based material. In embodiments of the invention, the replacement metal gate structure 1902 can include work-function metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). The multi-segmented metal gate structure 1902 and a high-k (HK) dielectric layer 1904 surround the stacked SiGe nanosheet channel regions 114B, 116B, 118B and regulate electron flow through the SiGe nanosheet channel regions 114B, 116B, 118B between the source 1102 and the drain 1104.

Subsequent to completing the above-described gate-late fabrication process in the pFET 110, the block mask 1702 is removed, and the metal gates in the nFET 140 and the pFET 110 are recessed to form the topmost metal gates 1602A, 1902, configured and arranged as shown in FIG. 19. The structure shown in FIG. 1A is formed by further recessing the topmost metal gates 1602A, 1902 and forming thereon self-aligned contact (SAC) caps 1204, 1206 for contact formation. Known semiconductor fabrication processes are used to form the necessary contacts (not shown).

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
    performing fabrication operations to form a nanosheet field effect transistor device, wherein the fabrication operations include:
        forming a sacrificial nanosheet and a channel nanosheet over a substrate; and
        forming a diffusion barrier layer between the sacrificial nanosheet and the channel nanosheet;
        wherein a diffusion coefficient of the diffusion barrier layer is selected to substantially prevent a predetermined semiconductor material from diffusing through the diffusion barrier layer.

2. The method of claim 1, wherein a thickness of the diffusion barrier layer is selected to substantially prevent the predetermined semiconductor material from diffusing through the diffusion barrier layer.

3. The method of claim 2, wherein the diffusion barrier layer comprises a rare earth oxide.

4. The method of claim 1, wherein the diffusion barrier layer comprises a single crystalline diffusion barrier material.

5. The method of claim 4, wherein:
    the sacrificial nanosheet comprise a single crystalline first semiconductor material; and
    the channel nanosheet comprises a single crystalline second semiconductor material.

6. The method of claim 5, wherein the fabrication operations further include:
    epitaxially growing the diffusion barrier layer over channel nanosheet; and
    epitaxially growing the sacrificial nanosheet over the diffusion barrier layer.

7. The method of claim 5, wherein the fabrication operations further include:
    epitaxially growing the diffusion barrier layer over sacrificial nanosheet; and
    epitaxially growing the channel nanosheet over the diffusion barrier layer.

8. The method of claim 1, wherein:
    the channel nanosheet comprises silicon;
    the sacrificial nanosheet comprises silicon germanium; and
    the predetermined semiconductor material comprises germanium.

9. The method of claim 1, wherein:
    the channel nanosheet comprises silicon germanium;
    the sacrificial nanosheet comprises silicon; and
    the predetermined semiconductor material comprises germanium.

10. A method of fabricating a semiconductor device, the method comprising:
    performing fabrication operations to form a nanosheet field effect transistor device, wherein the fabrication operations include:
        forming a first diffusion barrier layer across from a major surface of a substrate;
        forming a first nanosheet stack on an opposite side of the first diffusion barrier layer from the major surface of the substrate, wherein the first nanosheet stack comprises alternating channel nanosheets, stack diffusion barrier layers, and sacrificial nano sheets; and
        forming the first nanosheet stack such that the stack diffusion barrier layers are positioned between the sacrificial nano sheets and the channel nanosheets;
        wherein a diffusion coefficient of the stack diffusion barrier layer is selected to substantially prevent a predetermined semiconductor material from diffusing through the stack diffusion barrier layer.

11. The method of claim 10, wherein a thickness of each of the stack diffusion barrier layers is selected to substantially prevent the predetermined semiconductor material from diffusing through each of the stack diffusion barrier layers.

12. The method of claim 11, wherein the first diffusion barrier layer and the stack diffusion barrier layers comprise a rare earth oxide.

13. The method of claim 10, wherein:
    the first diffusion barrier layer and each of the stack diffusion barriers comprise a single crystalline diffusion barrier material;
    each of the sacrificial nanosheets comprises a single crystalline first semiconductor material; and
    each of the channel nano sheets comprises a single crystalline second semiconductor material.

14. The method of claim 13, wherein the fabrication operations further include:
  epitaxially growing the first nanosheet stack over the first diffusion barrier layer;
  epitaxially growing the first nanosheet stack by epitaxially and alternately growing the alternating channel nanosheets, stack diffusion barrier layers, and sacrificial nano sheets.

15. The method of claim 10, wherein:
  the first diffusion barrier layer and each of the stack diffusion barrier layers comprise a rare earth oxide;
  each channel nanosheet of the first nanosheet stack comprises silicon;
  each sacrificial nanosheet of the first nanosheet stack comprises silicon germanium; and
  the predetermined semiconductor material comprises germanium.

16. The method of claim 10, wherein:
  the first diffusion barrier layer and each of the stack diffusion barrier layers comprise a rare earth oxide;
  each channel nanosheet of the first nanosheet stack comprises silicon germanium;
  each sacrificial nanosheet of the first nanosheet stack comprises silicon; and
  the predetermined semiconductor material comprises germanium.

17. The method of claim 14, wherein the fabrication operations further include:
  forming a second nanosheet stack on an opposite side of the first diffusion barrier layer from the major surface of the substrate, wherein the second nanosheet stack comprises alternating second channel nanosheets, second stack diffusion barrier layers, and second sacrificial nanosheets;
  forming the second nanosheet stack such that the second stack diffusion barrier layers are positioned between the second sacrificial nanosheets and the second channel nanosheets;
  wherein a diffusion coefficient of the second stack diffusion barrier layer is selected to substantially prevent a second predetermined semiconductor material from diffusing through the second stack diffusion barrier layer;
  wherein the second diffusion barrier layer and each of the second stack diffusion barriers comprise the single crystalline diffusion barrier material;
  wherein each of the second sacrificial nanosheets comprises a single crystalline third semiconductor material;
  wherein each of the second channel nanosheets comprises a single crystalline fourth semiconductor material;
  epitaxially growing the second nanosheet stack over the first diffusion barrier layer; and
  epitaxially growing the second nanosheet stack by epitaxially and alternately growing the alternating second channel nanosheets, second stack diffusion barrier layers, and second sacrificial nanosheets;
  wherein the first diffusion barrier layer, the second diffusion barrier layer, each of the stack diffusion barrier layers, and each of the second stack diffusion barrier layers comprise a rare earth oxide;
  wherein each channel nanosheet of the first nanosheet stack comprises silicon;
  wherein each sacrificial nanosheet of the first nanosheet stack comprises silicon germanium;
  wherein each channel nanosheet of the second nanosheet stack comprises silicon germanium;
  wherein each sacrificial nanosheet of the second nanosheet stack comprises silicon;
  wherein the predetermined semiconductor material comprises germanium.

18. The method of claim 11, wherein the fabrication operations further include:
  performing inner spacer fabrication operations that include:
    replacing an end region of a selected one of the stack diffusion barrier layers of the first nanosheet stack with an inner spacer material end region;
    wherein an inner spacer of the nanosheet field effect transistor comprises:
      a central inner spacer body comprising the inner spacer material end region;
    a top inner spacer region comprising an end region of a first one of the stack diffusion barrier layers; and
    a bottom inner spacer region comprising an end region of a second one of the stack diffusion barrier layers;
    wherein the central inner spacer body is positioned between the top inner spacer region and the bottom inner spacer region.

19. A nanosheet field effect transistor device comprising:
  a substrate;
  a first channel nanosheet formed over the substrate;
  a second channel nanosheet formed over the first channel nanosheet;
  a multi-segmented inner spacer formed between the first channel nanosheet and the second channel nanosheet;
  a source region communicatively coupled to the first channel nanosheet and the second channel nanosheet;
  a drain region communicatively coupled to the first channel nanosheet and the second channel nanosheet; and
  a gate region communicatively coupled to the first channel nanosheet and the second channel nanosheet;
  wherein the multi-segmented inner spacer comprises a main body and a diffusion barrier region;
  wherein a diffusion coefficient of the diffusion barrier region is selected to substantially prevent a predetermined semiconductor material from diffusing through the diffusion barrier region.

20. The device of claim 19, wherein the diffusion barrier comprises a single crystalline rare earth oxide.

* * * * *